(12) United States Patent
Baraniuk et al.

(10) Patent No.: US 8,483,492 B2
(45) Date of Patent: Jul. 9, 2013

(54) METHOD AND APPARATUS FOR SIGNAL DETECTION, CLASSIFICATION AND ESTIMATION FROM COMPRESSIVE MEASUREMENTS

(75) Inventors: Richard Baraniuk, Houston, TX (US); Marco F. Duarte, Houston, TX (US); Mark A. Davenport, Houston, TX (US); Michael B. Wakin, Ann Arbor, MI (US)

(73) Assignee: William Marsh Rice University, Houston, TX (US)

( * ) Notice: Subject to any disclaimer, the term of this patent is extended or adjusted under 35 U.S.C. 154(b) by 1444 days.

(21) Appl. No.: 12/091,069

(22) PCT Filed: Oct. 25, 2006

(86) PCT No.: PCT/US2006/041454
§ 371 (c)(1),
(2), (4) Date: Apr. 22, 2008

(87) PCT Pub. No.: WO2007/050593
PCT Pub. Date: May 3, 2007

(65) Prior Publication Data
US 2008/0228446 A1 Sep. 18, 2008

Related U.S. Application Data

(60) Provisional application No. 60/729,983, filed on Oct. 25, 2005, provisional application No. 60/729,984, filed on Oct. 25, 2005, provisional application No. 60/732,374, filed on Nov. 1, 2005.

(51) Int. Cl.
*G06K 9/36* (2006.01)
*G06K 9/46* (2006.01)

(52) U.S. Cl.
USPC .......................................... 382/232; 375/240

(58) Field of Classification Search
USPC ............................ 382/232–253; 375/240–241
See application file for complete search history.

(56) References Cited

U.S. PATENT DOCUMENTS

| | | | |
|---|---|---|---|
| 4,570,229 | A | 2/1986 | Breen et al. |
| 5,627,533 | A | 5/1997 | Clark |
| 7,271,747 | B2 | 9/2007 | Baraniuk et al. |

(Continued)

*Primary Examiner* — Aaron W Carter
(74) *Attorney, Agent, or Firm* — 24IP Law Group; Timothy R. DeWitt

(57) ABSTRACT

The recently introduced theory of Compressive Sensing (CS) enables a new method for signal recovery from incomplete information (a reduced set of "compressive" linear measurements), based on the assumption that the signal is sparse in some dictionary. Such compressive measurement schemes are desirable in practice for reducing the costs of signal acquisition, storage, and processing. However, the current CS framework considers only a certain task (signal recovery) and only in a certain model setting (sparsity).

We show that compressive measurements are in fact information scalable, allowing one to answer a broad spectrum of questions about a signal when provided only with a reduced set of compressive measurements. These questions range from complete signal recovery at one extreme down to a simple binary detection decision at the other. (Questions in between include, for example, estimation and classification.) We provide techniques such as a "compressive matched filter" for answering several of these questions given the available measurements, often without needing to first reconstruct the signal. In many cases, these techniques can succeed with far fewer measurements than would be required for full signal recovery, and such techniques can also be computationally more efficient. Based on additional mathematical insight, we discuss information scalable algorithms in several model settings, including sparsity (as in CS), but also in parametric or manifold-based settings and in model-free settings for generic statements of detection, classification, and estimation problems.

21 Claims, 10 Drawing Sheets

U.S. PATENT DOCUMENTS

| | | | |
|---|---|---|---|
| 7,289,049 B1 * | 10/2007 | Fudge et al. | 341/123 |
| 7,511,643 B2 | 3/2009 | Baraniuk et al. | |
| 2002/0027882 A1 | 3/2002 | Burmeister et al. | |
| 2004/0117176 A1 * | 6/2004 | Kandhadai et al. | 704/223 |
| 2006/0029279 A1 | 2/2006 | Donoho | |
| 2011/0182352 A1 * | 7/2011 | Pace | 375/240.1 |

* cited by examiner (a)

(b)

METHOD AND APPARATUS FOR SIGNAL DETECTION, CLASSIFICATION AND ESTIMATION FROM COMPRESSIVE MEASUREMENTS

CROSS-REFERENCE TO RELATED APPLICATIONS

The present application claims the benefit of the filing date of U.S. Provisional Application Ser. No. 60/729,983, entitled "Random Filters for Compressive Sampling and Reconstruction," and filed on Oct. 25, 2005 by inventors Joel A. Tropp, Michael B. Wakin, Marco F. Duarte, Dror Baron and Richard G. Baraniuk.

The present application claims the benefit of the filing date of U.S. Provisional Application Ser. No. 60/729,984, entitled "Method And Apparatus For Sparse Signal Detection From Incoherent Projections," and filed on Oct. 25, 2005 by inventors Richard G. Baraniuk, Marco F. Duarte, Mark A. Davenport, and Michael B. Wakin.

The present application claims the benefit of the filing date of U.S. Provisional Application Ser. No. 60/732,374, entitled "Method And Apparatus For Compressive Sensing for Analog-to-Information Conversion," and filed on Nov. 1, 2005 by inventors Richard G. Baraniuk, Michael B. Wakin, Dror Baron, Marco F. Duarte, Mark A. Davenport, Yehia Massoud, Mohamed Elnozahi, Sami Kirolos, Tamer S. Mohamed, Tamer Ragheb and Joel A. Tropp.

The above cross-referenced related applications are hereby incorporated by reference herein in its entirety.

STATEMENT REGARDING FEDERALLY SPONSORED RESEARCH OR DEVELOPMENT

This work was supported by Contracts NSF CCF-0431150, NSF CNS-0435425, NSF CNS-0520280, NSF DMS Grant 0503299, ONR N00014-02-1-0353, AFOSR FA9550-04-0148, and DARPA/ONR N6001-06-1-2011.

1 BACKGROUND OF THE INVENTION

1.1 Field of the Invention

The present invention relates to methods and apparatus for signal detection, classification, estimation, and processing. The invention is applicable to all types of "signals" and data, including but not limited to signals, images, video and other higher-dimensional data.

1.2 Brief Description of the Related Art

Compression of signals is a necessity in a wide variety of systems. In general, compression is possible because often we have considerable a priori information about the signals of interest. For example, many signals are known to have a sparse representation in some transform basis (Fourier, DCT, wavelets, etc.) and can be expressed or approximated using a linear combination of only a small set of basis vectors.

The traditional approach to compressing a sparse signal is to compute its transform coefficients and then store or transmit the few large coefficients along with their locations. This is an inherently wasteful process (in terms of both sampling rate and computational complexity), since it forces the sensor to acquire and process the entire signal even though an exact representation is not ultimately required. In response, a new framework for simultaneous sensing and compression has developed recently under the rubric of Compressed Sensing (CS). CS enables a potentially large reduction in the sampling and computation costs at a sensor, specifically, a signal having a sparse representation in some basis can be reconstructed from a small set of nonadaptive, linear measurements (see E. Candès, J. Romberg, and T. Tao, "Robust uncertainty principles: Exact signal reconstruction from highly incomplete frequency information", *IEEE Trans. Information Theory*, Submitted, 2004 and D. Donoho, "Compressed sensing", *IEEE Trans. Information Theory*, Submitted, 2004). Briefly, this is accomplished by generalizing the notion of a measurement or sample to mean computing a linear function of the data. This measurement process can be represented in terms of matrix multiplication. In E. Candès, J. Romberg, and T. Tao, "Robust uncertainty principles: Exact signal reconstruction from highly incomplete frequency information", *IEEE Trans. Information Theory*, Submitted, 2004 and D. Donoho, "Compressed sensing", *IEEE Trans. Information Theory*, Submitted, 2004 conditions upon this matrix are given that are sufficient to ensure that we can stably recover the original signal using a tractable algorithm. Interestingly, it can be shown that with high probability, a matrix drawn at random will meet these conditions.

CS has many promising applications in signal acquisition, compression, medical imaging, and sensor networks; the random nature of the measurement matrices makes it a particularly intriguing universal measurement scheme for settings in which the basis in which the signal is sparse is unknown by the encoder or multi-signal settings in which distributed, collaborative compression can be difficult to coordinate across multiple sensors. This has inspired much interest in developing real-time systems that implement the kind of random measurement techniques prescribed by the CS theory. Along with these measurement systems, a variety of reconstruction algorithms have been proposed (see E. Candès, J. Romberg, and T. Tao, "Robust uncertainty principles: Exact signal reconstruction from highly incomplete frequency information", *IEEE Trans. Information Theory*, Submitted, 2004, D. Donoho, "Compressed sensing", *IEEE Trans. Information Theory*, Submitted, 2004, and J. Tropp and A. C. Gilbert, "Signal recovery from partial information via orthogonal matching pursuit", Preprint, April 2005), all of which involve some kind of iterative optimization procedure, and thus are computationally expensive for long signals with complexity typically polynomial in the signal length.

1.2.1 Compressed Sensing Background

Let $x \in \mathbb{R}^N$ be a signal and let the matrix $\Psi := [\psi_1, \psi_2, \ldots, \psi_Z]$ have columns that form a dictionary of vectors in $\mathbb{R}^N$. (This dictionary could be a basis or a redundant frame.) When we say that x is K-sparse, we mean that it is well approximated by a linear combination of K vectors from $\Psi$; that is, $x \approx \sum_{i=1}^{K} \alpha_{n_i} \psi_{n_i}$ with $K \ll N$.

1.2.2 Incoherent Measurements

Consider a signal x that is K-sparse in $\Psi$. Consider also an $M \times N$ measurement matrix $\Phi$, $M \ll N$, where the rows of $\Phi$ are incoherent with the columns of $\Psi$. For example, let $\Phi$ contain i.i.d. Gaussian entries; such a matrix is incoherent with any fixed $\Psi$ with high probability (universality). Compute the measurements $y = \Phi x$ and note that $y \in \mathbb{R}^M$ with $M \ll N$. The CS theory in E. Candès, J. Romberg, and T. Tao, "Robust uncertainty principles: Exact signal reconstruction from highly incomplete frequency information", *IEEE Trans. Information Theory*, Submitted, 2004 and D. Donoho, "Compressed sensing", *IEEE Trans. Information Theory*, Submitted, 2004 states that there exists an overmeasuring factor $c > 1$ such that only $M := cK$ incoherent measurements y are required to reconstruct x with high probability. That is, just cK incoherent measurements encode all of the salient information in the K-sparse signal x.

1.2.3 Reconstruction from Incoherent Projections

The amount of overmeasuring required depends on the (nonlinear) reconstruction algorithm. Most of the existing literature on CS has concentrated on optimization-based methods for signal recovery, in particular $l_1$ minimization. The $l_1$ approach seeks a set of sparse coefficients $\hat{\alpha}$ by solving the linear program in S. Chen, D. Donoho, and M. Saunders, "Atomic decomposition by basis pursuit", *SIAM Journal on Scientific Computing*, Vol. 20, No. 1, Pages 33-61, 1998

$$\hat{\alpha} = \arg\min_{\alpha} \|\alpha\|_1 \text{ subject to } \Theta\alpha = y,$$

where $\Theta = \Phi\Psi$ is the holographic basis. Greedy reconstruction algorithms build up a signal approximation iteratively by making locally optimal decisions. A particularly simple approach is that of Matching Pursuit (MP). As described in S. Mallat and Z. Zhang, "Matching pursuits with time-frequency dictionaries", *IEEE Trans. Signal Processing*, Vol. 41, No. 12, 1993, MP is an efficient greedy algorithm that selects basis vectors one-by-one from a dictionary to optimize the signal approximation at each step. In its application to CS, MP seeks a sparse representation of the measurement vector y in the dictionary $\{\theta_i\}$ consisting of column vectors from the holographic basis $\Theta$. In order to describe MP, we introduce the notation $$\langle x, y \rangle := \sum_{i=1}^{N} x_i y_i$$

where $x_i$ and $y_i$ denote the i-th entries of the length-N vectors x and y.

MP ALGORITHM FOR CS RECONSTRUCTION

1. Initialize the residual $r_0 = y$ and the approximation $\hat{\alpha} = 0$, $\hat{\alpha} \in \mathbb{R}^Z$. Initialize the iteration counter t=1.
2. Select the dictionary vector that maximizes the value of the projection of the residual onto $\Theta$ $$n_t = \arg\max_{i=1,\ldots,Z} \frac{\langle r_{t-1}, \theta_i \rangle}{\|\theta_i\|}.$$

3. Update the residual and the estimate of the coefficient for the selected vector $$r_t = r_{t-1} - \frac{\langle r_{t-1}, \theta_{n_t} \rangle}{\|\theta_{n_t}\|^2} \theta_{n_t},$$

$$\hat{\alpha}_{n_t} = \hat{\alpha}_{n_t} + \frac{\langle r_{t-1}, \theta_{n_t} \rangle}{\|\theta_{n_t}\|^2}.$$

4. Increment t. If t<T and $\|r_t\|_2 > \epsilon\|y\|_2$, then go to Step 2; otherwise, go to Step 5.
5. Obtain the signal estimate $\hat{x} = \Psi\hat{\alpha}$.

The parameter $\epsilon$ sets the target error level for convergence, and T sets the maximum number of algorithm steps.

1.2.4 Implications

The implications of CS are very promising. Instead of sampling a sparse signal N times and then compressing it, only cK<<N incoherent measurements suffice. CS with random measurements is advantageous for low-power and low-complexity sensors (such as in sensor networks) because it integrates sampling, compression and encryption of many different kinds of signals. However, several significant challenges to CS-based signal reconstruction remain. In particular, (i) the overmeasuring factor c required for perfect reconstruction can be quite large, typically $c \approx \log_2(N/K)$ for linear programming based reconstruction; (ii) the computational complexity of a linear program or greedy algorithm for signal reconstruction is high, and while greedy algorithms use fewer computations, they require an even larger factor c.

2 SUMMARY OF THE INVENTION

While the CS literature has focused almost exclusively on problems in signal reconstruction or approximation, this is frequently not necessary. For instance, in many signal processing applications (including most communications and many radar systems), signals are acquired only for the purpose of making a detection or classification decision. Tasks such as detection do not require a reconstruction of the signal, but only require estimates of the relevant sufficient statistics for the problem at hand.

This invention directly extracts these statistics from a small number of compressive measurements without ever reconstructing the signal. We have proposed several embodiments for extracting different kinds of information in a number of different settings. Unlike in traditional CS, this invention is not restricted to dealing with sparse signal models, but can exploit a variety of different signal models. Hence, this invention can use compressive measurements in cases where the traditional CS theory states that it may not even be possible to reconstruct the signal.

In a preferred embodiment, the present invention is a method for estimating the value of a function f of an unknown signal x from compressive measurements of the unknown signal x. The method comprises the steps of obtaining compressive measurements of an unknown signal x, determining a value of a function f most consistent with the obtained compressive measurements; and applying the function f. The determining step may comprise generating an estimate of x. The resulting decision may be used to select an appropriate basis for a full reconstruction of the signal x.

In another preferred embodiment, the present invention is a method for determining which among a plurality of candidate signal models is most consistent with a signal x using a set of compressive measurements of the signal x. The method comprises the steps of obtaining a set of compressive measurements of a signal x and comparing the set of compressive measurements to measurements one would expect under various candidate signal models. The comparing step may comprise comparing said set of compressive measurements with every candidate signal model. The comparing step further may comprise generating an estimate of x. The resulting decision may be used to classify the signal into classes corresponding to the respective dictionaries.

In still another preferred embodiment, the present invention is a method for estimating, from compressive measurements of a signal x, one or more unknown parameters $\theta$ on which the signal x depends. The method comprising the steps of obtaining compressive measurements of a signal x and determining an appropriate value of $\theta$ most consistent with the obtained compressive measurements of the signal x. The determining step may comprise generating an estimate of x that is then used to estimate $\theta$.

In still another preferred embodiment, the present invention is a method for determining whether an unknown signal x is sparse or compressible in a known dictionary Ψ from compressive measurements of the signal x. The method comprises the steps of obtaining compressive measurements of a signal x, determining whether the compressive measurements of the signal x are consistent with the signal x being sparse or compressible in the dictionary Ψ, and applying some measure of the sparsity or compressibility to the estimate of the signal x. The determining step may comprise attempting to obtain a rough reconstruction of the signal x using the dictionary Ψ.

In still another embodiment, the present invention is a method for determining which dictionary from among a plurality of dictionaries $\Psi_i$ an unknown signal x yields the most sparse or compressible representation of the signal x. The method comprises the steps of obtaining compressive measurements of a signal x, determining how consistent the compressive measurements of the signal x are with the signal x being sparse or compressible in each dictionary $\Psi_i$, and selecting a dictionary $\Psi_j$ that is most consistent with the compressive measurements of the signal x and the simultaneous assumption that the signal x is sparse in that dictionary. The determining step comprises attempting to obtain a rough reconstruction of the signal x using each dictionary $\Psi_i$. The selecting step comprises applying some measure of sparsity or compressibility to the estimates of the signal x.

In still another preferred embodiment, the present invention is a method for estimating a function f of a signal x, determining which among a plurality of candidate signal models is most consistent with the signal x, or determining whether the signal x is sparse or compressible in a known dictionary Ψ from compressive measurements of said signal x in the case where said signal x is contaminated with interference. The method comprises the steps of obtaining compressive measurements of a signal x, using a model for a structure of interference contaminating said signal x to obtain an estimate of the interference, and estimating the value of a function f of the signal x, determining a signal model most consistent with the compressive measurements of the signal x, or determining whether the signal x is sparse or compressible in a known dictionary Ψ.

In still another preferred embodiment, the present invention is a system for estimating a function f of an unknown signal x from compressive measurements of the unknown signal x. The system comprises a means such as an acquisition system, device, or encoder for obtaining compressive measurements of an unknown signal x, means such as a processor for determining a value of a function f most consistent with the obtained compressive measurements; and means such as a processor for applying the function f. The determining step may comprise generating an estimate of x. The resulting decision may be used to select an appropriate basis for a full reconstruction of the signal x.

In another preferred embodiment, the present invention is a system for estimating a function f of a signal x, determining which among a which among a plurality of candidate signal models is most consistent with the signal x, or determining whether the signal x is sparse or compressible in a known dictionary Ψ from compressive measurements of said signal x in the case where said signal x is contaminated with interference. The system comprises means such as an acquisition system, device, or encoder for obtaining compressive measurements of a signal x, means such as a processor for using a model for a structure of interference contaminating the signal x to obtain an estimate of the interference, and means such as a processor for estimating the value of a function f of the signal x, determining a signal model most consistent with the compressive measurements of the signal x, or determining whether the signal x is sparse or compressible in a known dictionary Ψ.

Still other aspects, features, and advantages of the present invention are readily apparent from the following detailed description, simply by illustrating preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

3 BRIEF DESCRIPTION OF THE DRAWINGS

For a more complete understanding of the present invention and the advantages thereof, reference is now made to the following description and the accompanying drawings, in which.

4 DETAILED DESCRIPTION OF THE PREFERRED EMBODIMENTS

While the CS literature has focused almost exclusively on sparse signal reconstruction, compressive measurements—by which we mean measurements that can be roughly thought of as linear functions of the data where the number of these functions is less than the length of the signal (or the number of Nyquist samples for continuous-time signals)—can also be used to solve signal detection problems for a number of different classes of signal models, and without ever reconstructing the signal. This is a much more efficient approach when the end goal of the system does not actually require a perfect reconstruction, but merely requires the estimation of some parameter or the detection of some signal.

Figure 1:
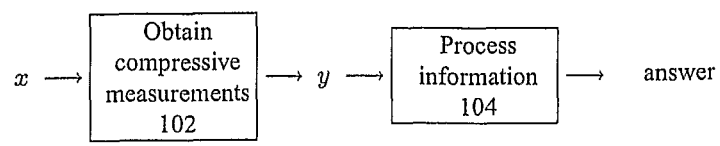
FIG. 1 is a drawing of an example system that obtains compressive measurements of a signal and then processes the data to solve the desired problem.

In general, the present invention is a method for extracting the desired information from a set of compressive measurements. For example, see FIG. 1. In FIG. 1 102 our system obtains compressive measurements y of a signal x. In FIG. 1 104 our system processes this data to extract the desired information which is then output by the system.

4.1 Compressive Matched Filtering for Estimation

In many tasks we are interested in estimating some function of the original signal, for example, depending on the scenario the mean or norm of the signal may be all that we really need to know about it. The following discussion will focus on estimating linear functions of the signal from incoherent measurements of the signal. However, while the discussion is restricted to linear functions for ease of exposition and analysis, one skilled in the art can easily extend these techniques and results to a variety of nonlinear functions.

Now, suppose that we would like to estimate a linear function of x:

$$f(x) = \langle s, x \rangle,$$

but we can only observe $$= \Phi(x+n) = \Phi x + \Phi n$$

where $\Phi$ is our known M×N measurement matrix and n is noise or some other disturbance. We use the notation $\langle ., . \rangle$ to denote the inner produce between two signals or vectors—this is an abstract concept for comparing two signals that depends on the context or domain of the signals. For example, the standard inner product for real-valued discrete signals is defined as $$\langle x_1, x_2 \rangle := \sum_{i=1}^{N} x_1(i) x_2(i)$$

and its counterpart for continuous-time signals simply replaces the sum with an integral. In cases where an inner product is defined, the size, or norm, of a signal can be defined as $\|x\|_2 = \sqrt{\langle x, x \rangle}$. See B. P. Lathi, "Signal Processing and Linear Systems", Berkeley-Cambridge, 1998, for example, for a more detailed discussion of inner products for various types of signals.

If we assume that the rows of $\Phi$ are normalized and orthogonal to each other, or even approximately so—in which case we call $\Phi$ an orthoprojector—then we can show that a simple method for estimating f(x) is to compute $$\hat{f}(x) = \sqrt{\frac{N}{M}} \langle \Phi s, y \rangle.$$

Under the assumption that n is white Gaussian noise, this can be shown to be the maximum-likelihood estimator of f(x). In the case where $\Phi$ is not an orthoprojector, we can account for this through the modification $$\hat{f}(x) = \sqrt{\frac{N}{M}} \langle \Phi s, (\Phi \Phi^T)^{-1} y \rangle,$$

which attempts to compensate for the correlation between rows of $\Phi$.

Returning to the case where $\Phi$ is (at least an approximate) orthoprojector, suppose further that $\Phi$ satisfies $$|\|\Phi x\|_2^2 - (M/N)\|x\|_2^2| \le \epsilon (M/N) \|x\|_2^2.$$

While not obvious, this is actually not a particularly restrictive condition. In particular, one can show that a matrix drawn at random will satisfy this with probability at least 1−δ provided that $$\epsilon < \sqrt{\frac{12 \log(2/\delta)}{M}}.$$

This is, in fact, the Key property that underlies many of the success of random matrices in CS.

Assuming that this condition is satisfied, we can demonstrate that $|\hat{f}(x) - f(x)|$ is bounded and decays as M grows and we increase the number of functions we wish to estimate as follows. Suppose that we would like to estimate $\langle x, s_i \rangle$ for i=1, . . . , |S|. We have $$(1-\epsilon)\sqrt{\frac{M}{N}} \le \frac{\|\Phi x\|_2}{\|x\|_2} \le (1+\epsilon)\sqrt{\frac{M}{N}},$$

$$(1-\epsilon)\sqrt{\frac{M}{N}} \le \frac{\|\Phi s_i\|_2}{\|s_i\|_2} \le (1+\epsilon)\sqrt{\frac{M}{N}},$$

$$(1-\epsilon)\sqrt{\frac{M}{N}} \le \frac{\|\Phi(x-s_i)\|_2}{\|x-s_i\|_2} \le (1+\epsilon)\sqrt{\frac{M}{N}}.$$

for any i∈{1, . . . , |S|} with probability at least 1−δ for the case where $\Phi$ is a projection onto a random subspace, or a randomly drawn matrix, provided that $$\epsilon < \sqrt{\frac{12 \log\left(\frac{2(2|S|+1)}{\delta}\right)}{M}}.$$

From the left-hand inequality of the last inequality, we get $$\sqrt{M/N}(1-\epsilon)(\|x\|_2^2 - 2\langle x, s_i \rangle + \|s_i\|_2^2) \le \|\Phi x\|_2^2 - 2\langle \Phi x, \Phi s_i \rangle + \|\Phi s_i\|_2^2.$$

Rearranging, we get:

$$2(\sqrt{N/M} \langle \Phi x, \Phi s_i \rangle - \langle x, s_i \rangle) \le$$
$$(\sqrt{N/M} \|\Phi x\|_2^2 - \|x\|_2^2) + (\sqrt{N/M} \|\Phi s_i\|_2^2 - \|s_i\|_2^2) + \epsilon$$
$$(\|x\|_2^2 + \|s_i\|_2^2 - 2\langle x, s_i \rangle) \le \epsilon \|x\|_2^2 + \epsilon \|s_i\|_2^2 + \epsilon$$
$$(\|x\|_2^2 + \|s_i\|_2^2 - \langle x, s_i \rangle) = 2\epsilon(\|x\|_2^2 + \|s_i\|_2^2 - \langle x, s_i \rangle),$$

and hence $$\sqrt{N/M} \langle \Phi x, \Phi s_i \rangle - \langle x, s_i \rangle \le \epsilon(\|x\|_2^2 + \|s_i\|_2^2 - 2\langle x, s_i \rangle).$$

Proceeding similarly using the right-hand side of the same inequality we get the same bound for $\langle x, s_i \rangle - \sqrt{N/M} \langle \Phi x, \Phi s_i \rangle$ and thus $$|\sqrt{N/M} \langle \Phi x, \Phi s_i \rangle - \langle x, s_i \rangle| \le \epsilon(\|x\|_2^2 + \|s_i\|_2^2 - \langle x, s_i \rangle).$$

for any i∈{1, . . . , |S|}.

Notice that as we increase $|S|$, the constant $\epsilon$ in our bound grows relatively slowly—$O(\sqrt{\log|S|})$—compared to the rate at which $\epsilon$ decays as we take more $$\text{measurements} - O\left(M^{-\frac{1}{2}}\right).$$

Thus we can simultaneously estimate a large number of functions of the unknown signal x using only a relatively small set of compressive measurements y.

Figure 2:
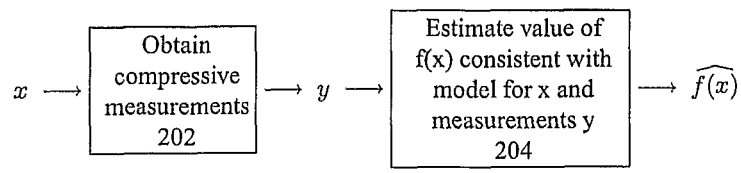
FIG. 2 is a drawing of an example system that obtains compressive measurements of a signal and then processes the data to estimate the value of a function of said signal.

Our system is illustrated in FIG. 2. In FIG. 2 202 our system obtains compressive measurements y of a signal x. In FIG. 2 204 our system processes this data to estimate the value of f(x) consistent with the model for x and the compressive measurements y, for example, using the techniques described above for the case where f is linear. The estimate $\widehat{f(x)}$ is then output by the system. Again, we emphasize that while the above discussion focused primarily on linear functions, one skilled in the art could easily extend these techniques and results to a variety of nonlinear functions.

4.2 Compressive Matched Filtering for Detection

We now consider a standard detection problem—to detect the presence or absence of a known signal s, but instead of observing x we observe $y=\Phi x$ where $\Phi \in \mathbb{R}^{M \times N}$, $M \leq N$. Our problem is to distinguish between $\tilde{\mathcal{H}}_{0\,0}$ and $\tilde{\mathcal{H}}_{1\,1}$:

$$\tilde{\mathcal{H}}_{0\,0}: y=\Phi n$$

$$\tilde{\mathcal{H}}_{1\,1}: y=\Phi s+\Phi n$$

where $s \in \mathbb{R}^N$ is a known signal, n is noise, and $\Phi$ is a known measurement matrix. For the case where $n \sim \mathcal{N}(0, \sigma^2 I_N)$ is i.i.d. Gaussian noise, we have $$f_0(y) = \frac{\exp\left(-\frac{1}{2}y^T(\sigma^2\Phi\Phi^T)^{-1}y\right)}{|\sigma^2\Phi\Phi^T|^{\frac{1}{2}}(2\pi)^{\frac{N}{2}}} \text{ and}$$

$$f_1(y) = \frac{\exp\left(-\frac{1}{2}(y-\Phi s)^T(\sigma^2\Phi\Phi^T)^{-1}(y-\Phi s)\right)}{|\sigma^2\Phi\Phi^T|^{\frac{1}{2}}(2\pi)^{\frac{N}{2}}}$$

Next, let $P_F = Pr(\mathcal{H}_1 \text{ chosen when } \mathcal{H}_0 \text{ true})$ and $P_D = Pr(\mathcal{H}_1 \text{ chosen when } \mathcal{H}_1 \text{ true})$ denote the false alarm rate and the detection rate respectively. The Neyman-Pearson (NP) detector is the decision rule that maximizes $P_D$ subject to the constraint that $P_F \leq \alpha$. It is not difficult to show (see L. L. Scharf, "Statistical Signal Processing: Detection, Estimation, and Time Series Analysis", Addison-Wesley, 1991, for example) that the NP-optimal decision rule is the likelihood ratio test:

$$\Lambda(y) = \frac{f_1(y)}{f_0(y)} \underset{\mathcal{H}_0}{\overset{\mathcal{H}_1}{\gtrless}} \eta$$

where $\eta$ is chosen such that $$P_F = \int_{\Lambda(y)>\eta} f_0(y)dy = \alpha.$$

By inserting the appropriate $f_0(y)$ and $f_1(y)$ and taking a logarithm we get an equivalent test that simplifies to $$y^T(\Phi\Phi^T)^{-1}\Phi s \underset{\tilde{\mathcal{H}}_0}{\overset{\tilde{\mathcal{H}}_1}{\gtrless}} \sigma^2 \log(\eta) + \frac{1}{2}s^T\Phi^T(\Phi\Phi^T)^{-1}\Phi s := \gamma.$$

We now define the compressive matched filter:

$$\tilde{t} := y^T(\Phi\Phi^T)^{-1}\Phi s.$$

It is useful to note that $\tilde{t} \sim \mathcal{N}(0, \sigma^2 s^T\Phi^T(\Phi\Phi^T)^{-1}\Phi s)$ under $\tilde{\mathcal{H}}_{0\,0}$ $\tilde{t} \sim \mathcal{N}(s^T\Phi^T(\Phi\Phi^T)^{-1}\Phi s, \sigma^2 s^T\Phi^T(\Phi\Phi^T)^{-1}\Phi s)$ under $\tilde{\mathcal{H}}_{1\,1}$.

Thus we have $$P_F = P(t > \gamma | H_0) = Q\left(\frac{\gamma}{\sigma\sqrt{s^T\Phi^T(\Phi\Phi^T)^{-1}\Phi s}}\right)$$

$$P_D = P(t < \gamma | H_1) = Q\left(\frac{\gamma - s^T\Phi^T(\Phi\Phi^T)^{-1}\Phi s}{\sigma\sqrt{s^T\Phi^T(\Phi\Phi^T)^{-1}\Phi s}}\right).$$

To set the threshold, we set $P_F = \alpha$, and thus $$\gamma = \sigma\sqrt{s^T\Phi^T(\Phi\Phi^T)^{-1}\Phi s} \ Q^{-1}(\alpha)$$

resulting in $$P_D(\alpha) = Q\left(Q^{-1}(\alpha) - \frac{\sqrt{s^T\Phi^T(\Phi\Phi^T)^{-1}\Phi s}}{\sigma}\right).$$

At this point it is worth considering the special case where $\Phi$ is an orthoprojector, in which case $\Phi\Phi^T=I_M$, reduces to $$\tilde{t} = \langle y, \Phi s \rangle,$$

in which case $$P_D(\alpha) = Q\left(Q^{-1}(\alpha) - \frac{\|\Phi s\|_2}{\sigma}\right).$$

Recall from Section 4.1 that with probability at least $1-\delta$ a random $\Phi$ (appropriately scaled) satisfies $$|\|\Phi x\|_2^2 - (M/N)\|x\|_2^2| \leq \epsilon(M/N)\|x\|_2^2.$$

provided that $$\epsilon < \sqrt{\frac{12 \log(2/\delta)}{M}}.$$

Thus, if we define $$SNR := \frac{\|\Phi s\|_2^2}{\sigma^2}$$

we get that with high probability $$Q(Q^{-1}(\alpha) - (1-\epsilon)\sqrt{M/N}\sqrt{SNR}) \le$$
$$P_D(\alpha) \le Q(Q^{-1}(\alpha) - (1+\epsilon)\sqrt{M/N}\sqrt{SNR}).$$

Thus we are able to conclude that for small $\epsilon$, $$P_D(\alpha) \approx Q(Q^{-1}(\alpha) - \sqrt{M/N}\sqrt{SNR}).$$

Thus, by comparing this result to the performance of the classic matched filter, as described in L. L. Scharf, "Statistical Signal Processing: Detection, Estimation, and Time Series Analysis", Addison-Wesley, 1991, for example, we see that it would be possible to design $\Phi$ that would not reduce our ability to detect s at all—in particular, if s is in the row-span of $\Phi$ where $\Phi$ is an orthoprojector we have that $\|\Phi s\|_2 = \|s\|_2$ and thus we lose nothing in terms of our ability to detect s. Of course, this makes sense since in this setting one of our rows of $\Phi$ actually implements the matched filter for s. In our setting, however, we are trying to build systems that are useful in the CS setting, and thus are not able to tailor $\Phi$ to the specific s we wish to detect. However, what we lose in accuracy we gain in universality—we can construct a measurement scheme that effectively captures relevant information without knowing s in advance.

Figure 3:
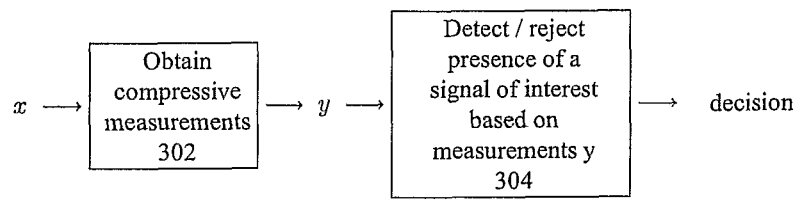
FIG. 3 is a drawing of an example system that obtains compressive measurements of a signal x and then processes the data to detect or reject the absence of a signal of interest in said signal x.

Our system is illustrated in FIG. 3. In FIG. 3 302 our system obtains compressive measurements y of a signal x. In FIG. 3 304 our system processes this data to detect or reject presence of a signal of interest in x based on the compressive measurements y, for example, using the techniques described above. The decision then output by the system. Although the above discussion focused primarily on the compressive matched filter designed for white Gaussian noise, one skilled in the art could easily extend these techniques and results to a variety of alternative detection settings and noise assumptions.

4.3 Compressive Matched Filtering for Classification

It is straightforward to generalize the previous setting to the case where we have a plurality of possible signals. In particular, suppose we have a set S of |S| signals that could be present, and we would like to select between the corresponding hypotheses:

$$\mathcal{H}_i: y = \Phi s_i + \Phi n,$$

for i=1, 2, ..., |S|, where each $s_i \in S$ is one of our known signals and as before, $n \sim \mathcal{N}(0, \sigma^2 I_N)$ is i.i.d. Gaussian noise and $\Phi$ is a known M×N measurement matrix.

Note that we can also consider the additional null hypothesis:

$$\mathcal{H}_{0,0}: y = \Phi n,$$

if desired.

It is straightforward to show that the sufficient statistics for this problem are $$\tilde{t}_i := y^T (\Phi \Phi^T)^{-1} \Phi s_i.$$

In general, we may require a complicated decision rule that compares each $\tilde{t}_i$ to a each other to determine the most likely hypothesis. However, in some cases our decision rule can simplify dramatically. For instance, if we assume, for the sake of simplicity, that $\Phi$ is an orthoprojector and that $\|s_i\|_2 = \epsilon$ for all i and the $s_i$ are orthogonal, then we can easily derive that the optimal detector is to select the hypothesis yielding the largest matched filter output. This detector has probability of error:

$$P_E = 1 - \frac{1}{|S|} \sum_{i=0}^{|S|-1} Pr(t_i > \max_{j \ne i} t_j)$$

Using standard techniques (see L. L. Scharf, "Statistical Signal Processing: Detection, Estimation, and Time Series Analysis", Addison-Wesley, 1991) one arrives at the upper bound of:

$$P_E \le (|S|-1) Q\left(\frac{\epsilon_\Phi}{\sqrt{2}\sigma}\right).$$

This upper bound is very loose when the SNR is small, but is reasonably tight when the SNR is high.

Figure 4:
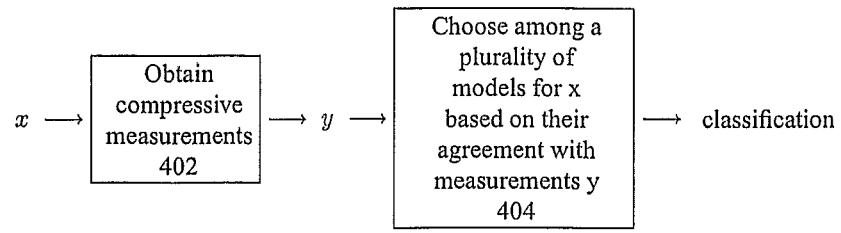
FIG. 4 is a drawing of an example system that obtains compressive measurements of a signal x and then processes the data to determine which among a plurality of models for said signal best agrees with the measurements. The system then classifies x according to which model was selected.

Our system is illustrated in FIG. 4. In FIG. 4 402 our system obtains compressive measurements y of a signal x. In FIG. 4 404 our system processes this data to choose among a plurality of models for x based on their agreement with the measurements y, for example, using the techniques described above. The decision then output by the system. Although the above discussion focused primarily on the compressive matched filter designed for white Gaussian noise, one skilled in the art could easily extend these techniques and results to a variety of alternative detection settings and noise assumptions. Also note that the same ideas can be applied to more general classification problems, as will be described in greater detail in Section 4.8.

4.4 Detection and Estimation for Sparse Signals

While the approaches described above are particularly efficient methods for detection, estimation, and classification, they do not provide a natural way to exploit a priori knowledge the system may have about the signals of interest. In particular, we may know that our signal is sparse or compressible in some dictionary $\Psi$, or it may lie on or near a low-dimensional manifold. In these cases, the CS theory indicates that compressive measurements offer some very powerful alternatives.

Specifically, we can utilize the assumption that our signal x is sparse in order to estimate the value of a function f(x) by using any kind of CS reconstruction or approximation algorithm, and then applying f. While this may be more expensive in terms of computation, in some scenarios it might significantly improve performance, and should not be ignored, as it may be that a very rough approximation might suffice to estimate f(x). Such a system has already been described for the case of a more general model and is illustrated in FIG. 2.

Similarly, the same technique would be useful in a variety of detection scenarios. For example, if our detection problem was not to determine whether a known signal s is present, but rather to determine whether an unknown, but sparse, signal x is present. In this case a very rough estimate or reconstruction of our signal would be sufficient, as all that is required to make a good decision is to know how large the largest coefficients in our reconstruction would be (these coefficients might be compared to a threshold or weighed jointly in some more complex way). Such a system has already been described for the case of a more general model and is illustrated in FIG. 3.

Both of these techniques have compelling applications in communications and surveillance. All man-made signals are sparse in some sense, and this structure can be exploited to aid in detection and estimation in a variety of challenging settings. A more specific, and extremely challenging, example will be discussed in greater detail in Section 4.6.4.

4.5 Classification for Sparse Signals

The properties of compressive measurements also allow us to formulate a simple algorithm for classification under the assumption that the interference is sparse or compressible. Thus, consider a signal of interest x of length N and sparsity $\leq K$ in one of C bases (or dictionaries). Each basis represents a signal class. Assume that the different bases are incoherent with each other. Our goal in this classification problem is to determine which class best fits the signal. If the signal were available, then we could perform sparse approximation using each basis and then choose the class giving the sparsest representation. This would require all N signal samples to make the decision.

However, thanks to their universality, one set of cK random measurements suffices to find the sparsest representation of x from the C classes. This problem can be solved using a greedy algorithm such as Orthogonal Matching Pursuit (OMP), as described in J. Tropp and A. C. Gilbert, "Signal recovery from partial information via orthogonal matching pursuit", Preprint, April 2005, which tracks the signal sparsity as it proceeds; the number of OMP iterations equals the sparsity of x in the corresponding basis. Therefore, by simultaneously running OMPs with each of the C bases, we can assign the signal to the class whose OMP iteration terminates first. The incoherence between the bases guarantees that only one class will have a sparse representation for the signal. Another option would be to run either OMP or MP for a (small) fixed number of iterations with each basis and then assign the signal to the class resulting in the smallest residual. As in IDEA, we expect that we can even reduce the number of measurements below the cK required for high-quality sparse approximation.

In addition to greedy methods, any possible CS reconstruction algorithm could be used instead. Furthermore, there are a wide variety of possible measures of sparsity that would allow us to select the most appropriate dictionary. For instance, the number of nonzero entries, the $l_1$ norm, or the rate of decay of the reconstructed coefficients are acceptable measures of sparsity or compressibility.

Such a system has already been described for the case of a more general model and is illustrated in FIG. 4. These techniques also have compelling applications in communications and surveillance, and furthermore, such a system would be an excellent pre-processing step for a system that may then want to reconstruct a signal using the dictionary that will provide the highest-quality reconstruction.

4.6 Greedy Interference Cancellation for Estimation and Detection

4.6.1 Detection Problem Setup

The properties of compressive measurements also allow us to formulate a simple algorithm for detection, classification, and estimation in the presence of interference, under the assumption that the interference is sparse or compressible. (While something similar is possible using the assumption that our interference lies on a low-dimensional manifold, we postpone discussion of this scenario to Section 4.7).

Thus, suppose we have a dictionary $\Psi$ which is constructed so that the interference and the signal can both be represented sparsely. For example, it may be the concatenation of two bases, one for the interference and one for the signal. Thus we can suppose that our dictionary contains particular elements of interest that we wish to detect as components of x, and particular elements we may regard as interference. For example, we might want to detect smooth signals, and $\Psi$ might contain a basis of sinusoids or orthogonal polynomials.

Let $\Omega \subset \{1, 2, \ldots, Z\}$ denote the set of target indices that represent these components of interest, and let $\Psi_\Omega$ and $\alpha_\Omega$ denote the corresponding restrictions of the dictionary and coefficients, respectively. Given a set of compressive measurements $y=\Phi x$, we aim to determine whether or not x was generated using any of the target components in $\Psi_\Omega$. That is, we must decide between two hypotheses:

$$\mathcal{H}_0: \alpha_\Omega=0 \text{ vs. } \mathcal{H}_1: \alpha_\Omega \neq 0. \qquad (1)$$

Figure 5:
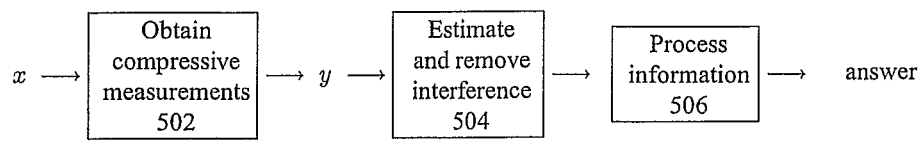
FIG. 5 is a drawing of an example system that obtains compressive measurements of a signal x and then processes the data to estimate interference in the signal, and then processes the compressive measurements exploiting this estimate to solve the desired problem.

An example system is illustrated in FIG. 5. In FIG. 5 502 our system obtains compressive measurements y of a signal x. In FIG. 5 504 our system processes this data to estimate the interference. Then, in FIG. 5 this estimate is combined with the compressive measurements to estimate the value of a function, detect or reject the presence of a signal of interest, or classify x based on a plurality of models.

4.6.2 Sparse Signal Detection

In the case where $\Psi$ is an overcomplete dictionary, difficulties may arise because the columns of $\Psi$ are correlated with each other, so that the presence of one element interferes with the detection of another element. This is analogous to multiuser detection, a classical problem in communications that is known to be NP-hard, as described in S. Verdú, "Multiuser Detection", Cambridge Univ. Press, 1998. A practical iterative decoding algorithm, known as successive cancelation or onion peeling, is very similar in spirit to MP. These algorithms identify the strongest component of $\Psi$ in x, remove it from x, and then proceed to find the next strongest component. Essentially, this invokes a model for x, namely that it has a sparse expansion in $\Psi$. This suggests that for our detection problem we should employ a greedy algorithm such as MP from Section 1.2.3. We can then look for significant energy among the coefficients $\alpha_\Omega$.

Thus, we now assume that instead of x we observe $y=\Phi x$. In this case, y will have the same linear expansion among the columns of $\Theta$ that x has among the columns of $\Psi$. This strongly motivates an MP approach to solving the sparse detection problem with compressive measurements. As in CS reconstruction, random measurements provide in some sense a universal representation of the sufficient statistics for a wide range of signal classes.

It is important to note that, just as in any detection problem, it is not necessary to reconstruct precise values for the expansion coefficients $\alpha_\Omega$. Rather, we generally only need to know whether there is a significant contribution from these elements. Moreover, there is no requirement to accurately reconstruct the coefficients $\alpha_\Omega c$. This allows us to reduce considerably the number of measurements and computations required when detecting compared to reconstructing.

4.6.3 Incoherent Detection and Estimation Algorithm (IDEA)

Based on the above motivation, we propose the Incoherent Detection and Estimation Algorithm (IDEA) for signals hidden in incoherent measurements. IDEA is based on the MP reconstruction algorithm from Section 1.2.3 with two important modifications. First, we set the number of iterations T to be much smaller than necessary for reconstruction. Second, we replace Step 5 with the following:

5. If $\|\hat{\alpha}_\Omega\|_\infty$ exceeds a threshold $\gamma$, detect $\mathcal{H}_1$; else choose $\mathcal{H}_0$.

Due to the smaller T, the vector $\hat{\alpha}$ might not accurately reconstruct the signal. However, it may still contain sufficient information for detection. Our detection decision is made simply by examining the components $\hat{\alpha}_\Omega$ and comparing the maximum coefficient to the threshold $\gamma$. We will see in the next section that, despite potential imprecision in $\hat{\alpha}$, the detection decision can be remarkably accurate. Indeed, the detection process can succeed even when M is far too small to recover x. Thus, the number of measurements can be scaled back significantly if detection, rather than reconstruction, is the ultimate goal.

4.6.4 Example: Wideband Signals with Narrowband Interference

Dictionary-based Detection

IDEA is very well suited to detecting signals in the presence of interference and noise when the signals and interference can be sparsely represented in distinct dictionaries. We formalize the problem as follows. We aim to distinguish between two hypotheses $$\mathcal{H}_0: x=n+w \text{ vs. } \mathcal{H}_1: x=s+n+w,$$

where s denotes the signal of interest (from some class of signals), n denotes the interference, and w denotes additive white Gaussian noise with $w \sim \mathcal{N}(0, \sigma_w^2 I)$. Each component is sparse in some dictionary; that is, $s = \Psi_s \alpha_s$, $\|\alpha_s\|_0 = K_s$, where the $l_0$ "norm" $\|\alpha\|_0$ merely counts the number of nonzero components in the vector $\alpha$. and $n = \Psi_n \alpha_n$, $\|\alpha_n\|_0 = K_n$; however, the noise is not sparse in either dictionary. We can restate the detection problem in terms of the concatenated dictionaries and coefficients, writing $$x = [\Psi_s \Psi_n] \begin{bmatrix} \alpha_s \\ \alpha_n \end{bmatrix} + \omega =: \Psi\alpha + \omega.$$

Now, from the measurements $y = \Phi x$ we must distinguish between the two hypotheses $$\mathcal{H}_0: \alpha_s = 0 \text{ vs. } \mathcal{H}_1: \alpha_s \neq 0.$$

We set $\Omega$ in IDEA such that $\alpha_\Omega = \alpha_s$ to obtain detection decisions.

IDEA offers several advantages in this detection scenario. First, the sparsest approximation of y will tend to correctly separate the contributions from the signal and interference components if the two dictionaries are incoherent. Second, the additive noise is attenuated during sparse approximation since its energy is distributed over all of the expansion coefficients.

Wideband Signals in Strong Narrowband Interference

As a concrete example, we study the problem of detecting from random measurements the presence of weak wideband signals corrupted by strong interfering narrowband sources and additive noise.

This is a potentially difficult problem: The weakness of the wideband signal precludes an energy detection approach, and if the wideband and narrowband signals overlap in the frequency domain, then bandpass interference suppression may damage the signal beyond detectability. We seek to detect wideband signals that are frequency modulated chirps. Chirps are sparsely represented in a chirplet dictionary that is incoherent with the Fourier basis that sparsifies narrowband signals, as noted in R. G. Baraniuk and D. L. Jones, "Shear madness: new orthogonal bases and frames using chirp functions", *IEEE Trans. Signal Processing*, Vol. 41, No. 12, pages 3543-3549, 1993. Hence, we can apply IDEA directly. We choose a chirplet dictionary for $\Psi_s$ and the Fourier basis for $\Psi_n$.

Simulations

Figure 6:
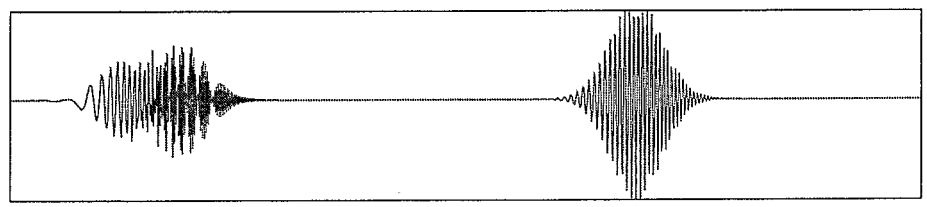
FIG. 6(a) is a sample wideband chirp signal.
FIG. 6(b) is the same wideband chirp signal as in FIG. 6(a) embedded in strong narrowband interference.
Figure 6:
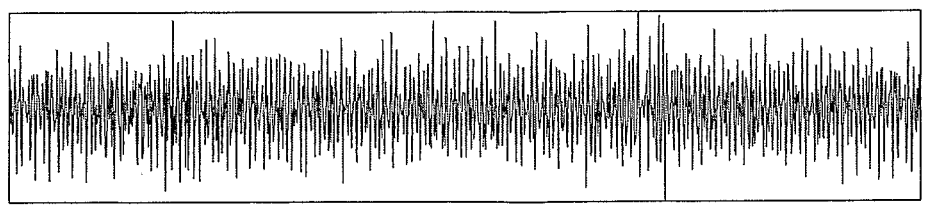

We set the signal length to N=1024 and construct a 432-element normalized chirplet dictionary consisting of 64-sample chirplets having 16 start times, 9 starting frequencies, and 3 chirp rates. An example of such a chirp is illustrated in FIG. 6(a). When present, we generate the chirp signal $s = \Psi_s \alpha_s$ with $K_s = 5$, and we assign $\mathcal{N}(0, \sigma_s^2)$ coefficients to the nonzero elements of $\theta_s$. For the interference we set $K_n = 6$ and assign $\mathcal{N}(0, \sigma_n^2)$ coefficients to its nonzero elements. An example of a chirp embedded in interference is illustrated in FIG. 6(b). The M×N measurement matrix $\Phi$ contains i.i.d. $\mathcal{N}(0,1)$ entries. Since the number of measurements required for signal reconstruction is proportional to $K_s + K_n$, the detection results will extend directly to other sparsity levels when the number of measurements increases appropriately.

Figure 7:
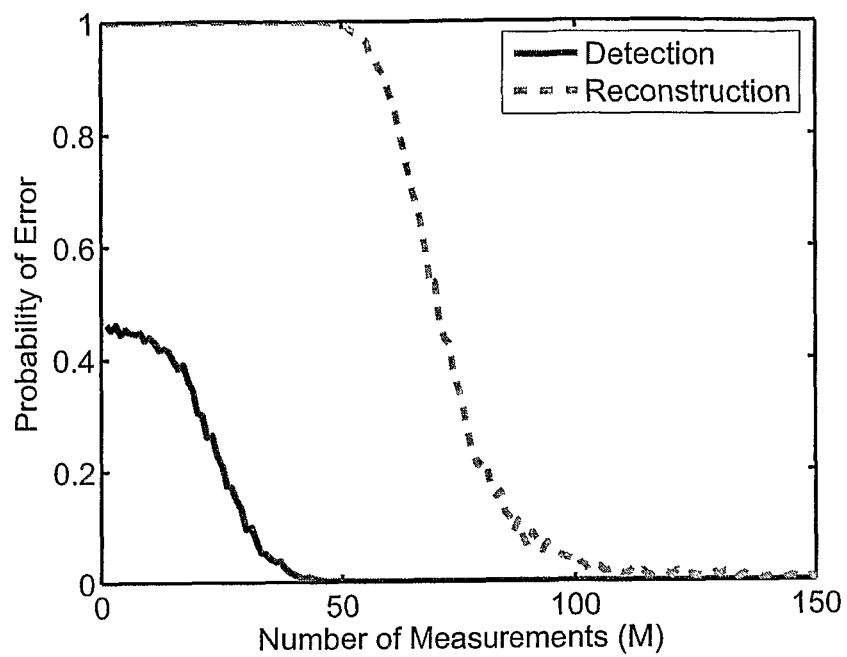
FIG. 7 is a graph of the probability of error (with respect to a random matrix draw) to reconstruct and detect chirp signals embedded in strong sinusoidal interference (SIR=−6 dB) using greedy algorithms.

Detection vs. Reconstruction:

Given the measurements $y = \Phi x$, we attempt to reconstruct x using MP; the probability of a reconstruction error as a function of the number of measurements M (averaged over 10,000 trials) is given in FIG. 7. We define an error as failing to achieve a sufficiently small reconstruction error in the wideband signal s; hence $P_e = \Pr(\|s - \hat{s}\|_2 > 10^{-3} \|s\|_2)$. Given the same measurements, we also attempt to detect the presence of a wideband component s; the probability of a detection error as a function of M (averaged over 10,000 trials) is also given in FIG. 7. We use IDEA with T=15 and $\epsilon = 0$ (we do not check for convergence) and set $\Pr(\mathcal{H}^0) = \Pr(\mathcal{H}^1) = \frac{1}{2}$. We choose $\gamma$ to minimize $P_e$ based on Monte Carlo simulations. The chirps are embedded in strong interference; FIG. 7 features Signal-to-Interference Ratio SIR:=10 $\log_{10}(\sigma_s^2/\sigma_n^2) = -6$ dB and $\sigma_w = 0$. We see that low-$P_e$ signal detection requires only about 50 measurements, while low-$P_e$ reconstruction requires about 150 measurements. Moreover, each MP detection requires approximately 4× fewer iterations than MP reconstruction. We note that a target $P_e$ can be achieved with fewer iterations by obtaining more measurements, thus providing a valuable tradeoff.

Figure 8:
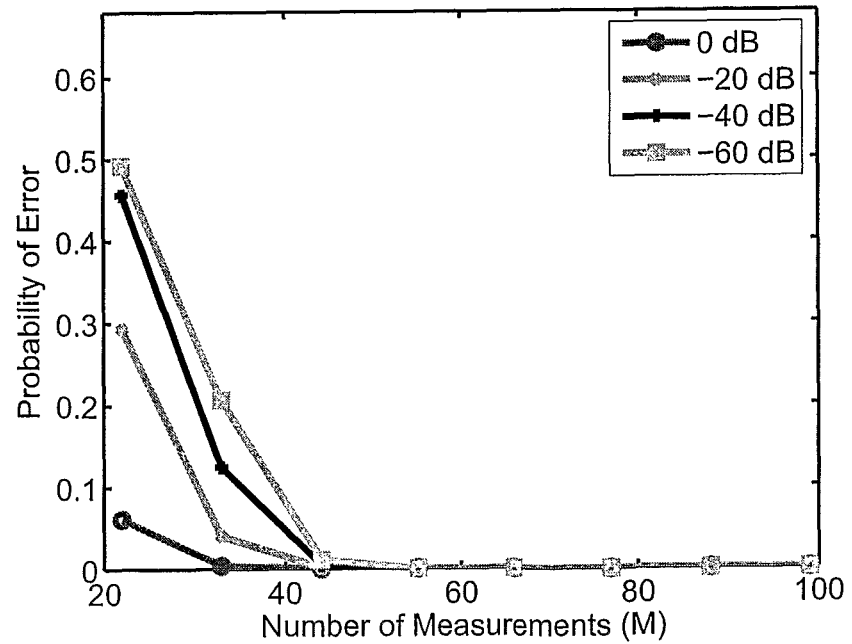
FIG. 8 is a graph illustrating the performance of wideband chirp detection in the presence of strong narrowband interference; each curve is a different SIR.

Effect of Interference:

We now focus exclusively on detection performance. FIG. 8 illustrates $P_e$ as a function of M for several SIRs. For M<50, detection performance degrades with the SIR. However, M>50, detection performance remains largely unaffected. We believe that this is due to the general robustness of CS recovery—for M>50 there seems to be enough information in the measurements to accurately estimate the interference components (those with the most energy). However, with few measurements, some of the interference energy is incorrectly assigned to the signal components, which corrupts performance.

Figure 9:
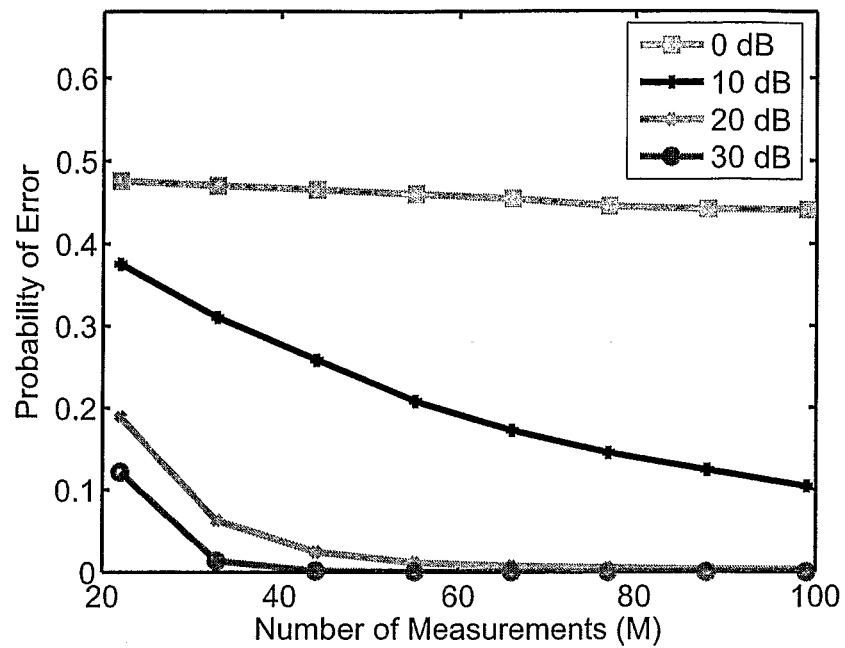
FIG. 9 is a graph illustrating the performance of wideband chirp detection in the presence of strong narrowband interference and white noise interference; SIR=−6 dB, and each curve is a different SNR.

Effect of Noise:

IDEA shares the same robustness to additive white Gaussian noise as CS reconstruction as described in E. Candès, J. Romberg, and T. Tao, "Robust uncertainty principles: Exact signal reconstruction from highly incomplete frequency information", *IEEE Trans. Information Theory*, Submitted, 2004. FIG. 9 illustrates the detection performance in noise for different levels of the Signal-to-Noise Ratio (SNR) at the fixed SIR=−6 dB. We see a graceful performance degradation as the SNR decreases; indeed, when the power of the noise becomes comparable to that of the signal to be detected, most detection methods suffer.

Figure 10:
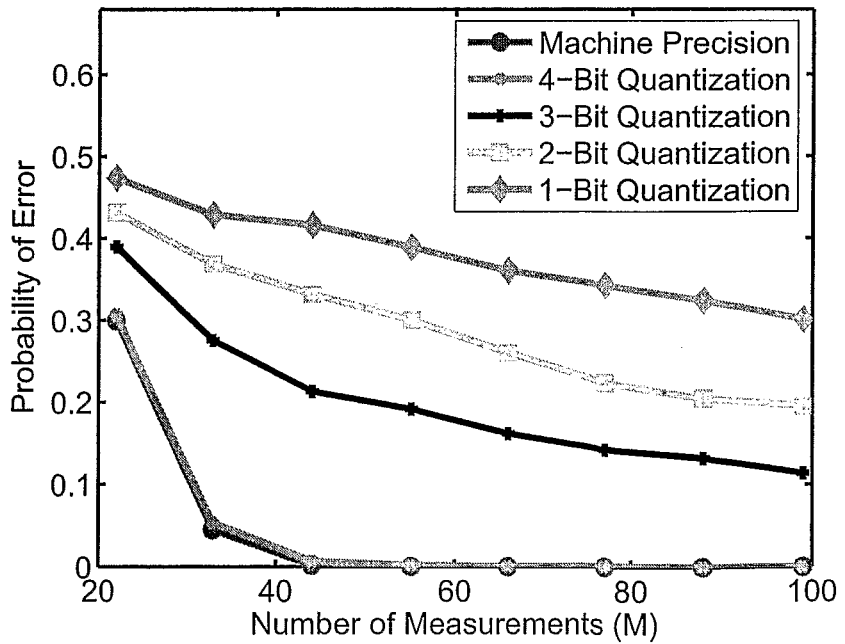
FIG. 10 is a graph illustrating the effect of measurement quantization on the performance of wideband chirp detection in the presence of strong narrowband interference; SIR=−20 dB, and each curve is a different number of quantization levels.

Effect of Quantization:

FIG. 10 illustrates the detection performance for different levels of quantization of the measurements, with a fixed SIR=−20 dB and no noise. Note in particular that the detection performance is remarkably robust with 4-bit (16 level) quantization; we expect the acceptable level of quantization to be dependent on the SIR and SNR of the received signal.

4.7 Parametric and Manifold-based Models

Figure 11:
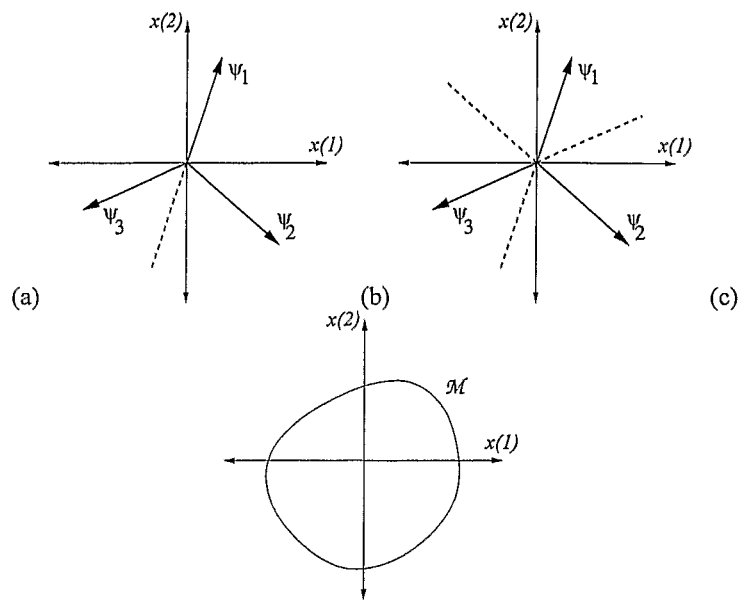
FIG. 11(a) is a drawing of one simple model for signals in $\mathbb{R}^2$: the linear space spanned by one element of the dictionary Ψ.
FIG. 11(b) is a drawing of one simple model for signals in $\mathbb{R}^2$: the nonlinear set of 1-sparse signals that can be built using Ψ.
FIG. 11(c) is a drawing of one simple model for signals in $\mathbb{R}^2$: a manifold $\mathcal{M}$.

Model-based processing of compressive measurements can be applied in scenarios more general than sparse representations. For example, manifold signal models generalize the notion of concise signal structure beyond the framework of bases and representations (see FIG. 11). These models arise in more broad cases where (i) a K-dimensional parameter θ can be identified that carries the relevant information about a signal and (ii) the signal $x_\theta \in \mathbb{R}^N$ changes as a (typically nonlinear) function of these parameters. In general, this dependence may not be neatly reflected in a sparse set of transform coefficients. Some simple explicit examples include:

- time delay of a 1-D signal (parameterized by 1 variable for translation);
- amplitude, phase, and frequency of a pure sinusoid (3 parameters);
- starting and ending time and frequency of a linear radar chirp (4 parameters);
- local signal parameters such as the configuration of a straight edge in a small image segment (2 parameters: slope and offset);
- global parameters affecting signal generation such as the position of a camera or microphone recording a scene or the relative placement of objects/speakers in a scene; and
- parameters governing the output of some articulated physical system as described in D. L. Donoho and C. Grimes, "Image manifolds which are isometric to Euclidean space", *J. Math. Imaging and Computer Vision,* 23(1), July 2005 and M. B. Wakin, D. L. Donoho, H. Choi, and R. G. Baraniuk, "The multiscale structure of non-differentiable image manifolds", *Proc. Wavelets XI at SPIE Optics and Photonics,* San Diego, August 2005, SPIE.

In these and many other cases, the geometry of the signal class forms a nonlinear K-dimensional submanifold of $\mathbb{R}^N$, $$\mathcal{M} = \{x_\theta : \theta \in \Theta\},$$

where Θ is the K-dimensional parameter space. In general, Θ itself can be a K-dimensional manifold and need not be a subset of $\mathbb{R}^K$. We refer the reader to I. Ur Rahman, I. Drori, V. C. Stodden, D. L. Donoho, and P. Schroeder, "Multiscale representations for manifold-valued data", Preprint, 2004 for an excellent overview of several manifolds with relevance to signal processing, including the rotation group SO(3), which can be used for representing orientations of objects in 3-D space. (Note the dimension K can be interpreted as an "information level" of the signal, somewhat analogous to the number of nonzero components in a sparse signal representation.)

Low-dimensional manifolds have also been proposed as approximate models for nonparametric signal classes such as images of human faces or handwritten digits in G. E. Hinton, P. Dayan, and M. Revow, "Modelling the manifolds of images of handwritten digits", *IEEE Trans. Neural Networks,* 8(1), 1997 and D. S. Broomhead and M. J. Kirby, "The Whitney Reduction Network: A method for computing autoassociative graphs", *Neural Computation,* 13, 2595-2616, 2001.

4.7.1 Parameter Estimation

Signal-based Parameter Estimation

Figure 12:
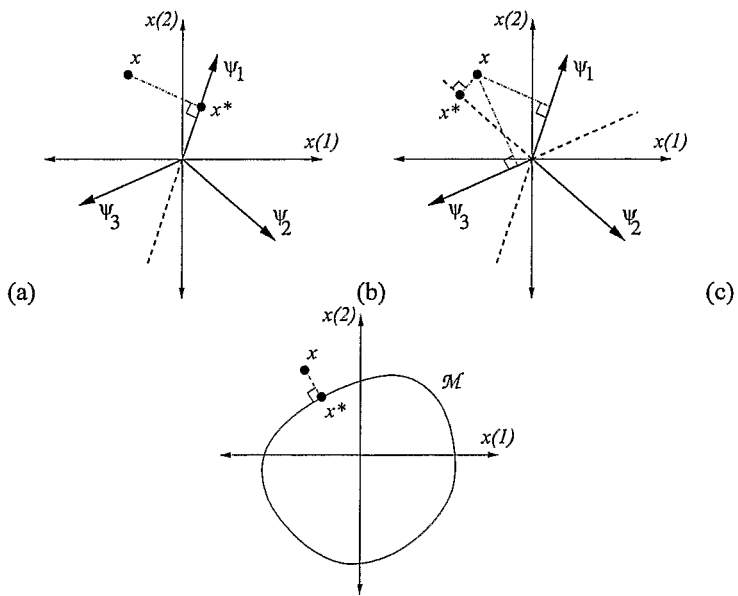
FIG. 12(a) is an illustration of one type of model-based approximation for a signal $x \in \mathbb{R}^2$ with an $l_2$ error criterion $\mathbb{R}^2$: linear approximation using one element of the dictionary $\Psi$.
FIG. 12(b) is an illustration of one type of model-based approximation for a signal $x \in \mathbb{R}^2$ with an $l_2$ error criterion $\mathbb{R}^2$: nonlinear approximation, choosing the best 1-sparse signal that can be built using $\Psi$.
FIG. 12(c) is an illustration of one type of model-based approximation for a signal $x \in \mathbb{R}^2$ with an $l_2$ error criterion $\mathbb{R}^2$: manifold-based approximation, finding the nearest point on $\mathcal{M}$.

Let us consider the problem of finding the best manifold-based approximation to a signal x, supposing the signal is directly available for this estimation (see also FIG. 12).

Suppose that $\mathcal{M} = \{x_\theta : \theta \in \Theta\}$ is a parameterized K-dimension manifold and that we are given a signal x that is believed to approximate $x_\theta$ for an unknown $\theta \in \Theta$. From x we wish to recover an estimate of θ. We may formulate this parameter estimation problem as an optimization, writing the objective function $$D(\theta) = \|x_\theta - x\|_2^2$$

and solving for $$\theta^* = \operatorname*{argmin}_{\theta \in \Theta} D(\theta).$$

Supposing D is differentiable, this minimization can be approached using standard techniques in nonlinear parameter estimation such as Newton's method. These techniques involve, for example, computing tangents to the manifold onto which the current estimate is successively projected, yielding a series of estimates that converge to the optimal solution.

In some cases of practical interest, however, D may not be differentiable, due for example to edges in an image $x_\theta$ that move as a function of θ. In these cases, tangents to the manifold will not exists. Instead, we have proposed a multiscale Newton procedure for parameter estimation on nondifferentiable manifolds—the idea is to regularize the image by convolving with a smoothing filter $g_s$ (for example a Gaussian kernel of width, or "scale", s), which yields a differentiable manifold on which standard parameter estimation techniques can be applied, and then to relax the regularization on the image, refine the current parameter estimate, and so on. More information is available in M. B. Wakin, D. L. Donoho, H. Choi, and R. G. Baraniuk, "The multiscale structure of non-differentiable image manifolds", *Proc. Wavelets XI at SPIE Optics and Photonics,* San Diego, August 2005, SPIE.

Parameter Estimation from Compressive Measurements

Let us now consider the problem of finding the best manifold-based approximation to a signal $x \in \mathbb{R}^N$, provided only with compressive measurements y=Φx of x, where $\Phi: \mathbb{R}^N \to \mathbb{R}^M$. One possibility for estimating θ from y would be a two-step procedure: first, use y to recover an estimate of x (using traditional techniques in compressed sensing, for example), and second, use this estimate of x in the standard procedures for parameter estimation described above. Note that this may be impractical or even impossible if x does not obey, for example, a sparse or compressible model.

Due to new mathematical insights, however, we can propose a more direct procedure. The key theoretical basis for this procedure is the observation that supposing the number of measurements M is sufficiently large, the manifold $\mathcal{M} \subset \mathbb{R}^N$ embeds stably as a subset $\Phi \mathcal{M} \subset \mathbb{R}^M$—that is, with high probability, no two points from $\mathcal{M}$ in $\mathbb{R}^N$ are mapped to the same point in $\mathbb{R}^M$, and in fact all pairwise distances between points on $\mathcal{M}$ in $\mathbb{R}^N$ are well preserved on its image $\Phi \mathcal{M}$ in $\mathbb{R}^M$.

What this suggests is that, for our paramater estimation problem, it is not necessary to first recover x from y—instead, we can directly estimate θ from the measurements y themselves, simply by performing manifold-based estimation by searching along the manifold $$\Phi \mathcal{M} := \{y_\theta \in \mathbb{R}^M : \theta \in \Theta\} = \{\Phi x_\theta \in \mathbb{R}^M : \theta \in \Theta\}$$

for the nearest agreement with the measurements y=Φx. We now discuss the solution to this problem in the cases of differentiable and nondifferentiable manifolds.

4.7.2 Differentiable Manifolds

Again, supposing $\mathcal{M}$ is differentiable, then $\Phi \mathcal{M}$ will remain differentiable, and standard techniques such as Newton's method can be used to solve this optimization problem.

In order to illustrate the basic principles in action, we now consider a few examples involving random projections of parameterized manifolds.

Gaussian Bumps

Our first experiment involves a smooth image appearance manifold (IAM) in which each image contains a smooth Gaussian bump. For a given N-pixel image $x_\theta$, the parameter θ describes both the position (2-D) and width (1-D) of the bump; see FIG. 13(a) for one such image. (Because the bump is smooth, the IAM will be smooth as well.) We fix the amplitude of each bump equal to 1.

Figure 13:
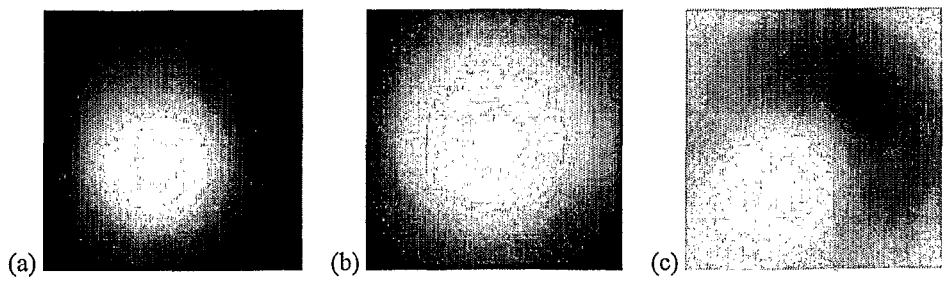
FIG. 13(a) is a sample image of a Gaussian bump parameterized by its position and width.
FIG. 13(b) is an image of the initial guess for the Gaussian bump parameters for use in an algorithm to estimate the true parameters from compressive measurements of the image in FIG. 13(a). From just 14 random measurements we can recover the unknown parameters of such an image with very high accuracy and with high probability.
FIG. 13(c) is an image of the error between the original image in FIG. 13(a) and the initial guess in FIG. 13(b).

We consider the problem of estimating, from a collection of measurements y=Φx_θ, the unknown parameter θ. Our test image x_θ is shown in FIG. 13(a); we choose N=64×64=4096. To estimate the unknown parameter, we use 5 iterations of Newton's method, ignoring the second derivative term. Our starting guess for this iterative algorithm is shown in FIG. 13(b). (We chose this guess manually, but it could also be obtained, for example, by using a grid search in $\mathbb{R}^M$.) FIG. 13(c) shows the relative error between the true image and the initial guess. For various values of M, we run 1000 trials over different realizations of the random Gaussian M×N matrix Φ.

We see in this experiment that the 3-D parameter θ can be recovered with very high accuracy using very few measurements. When M=7(=2·3+1), we recover θ to very high accuracy (image MSE of $10^{-8}$ or less) in 86% of the trials. Increasing the probability of accurate recovery to 99% requires just M=14 measurements, and surprisingly, with only M=3 we still see accurate recovery in 12% of the trials. It appears that this smooth manifold is very well-behaved under random projections.

Chirps

Figure 14:
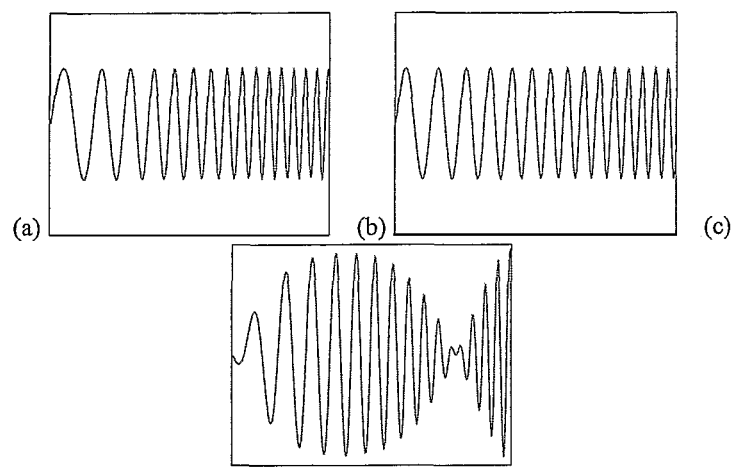
FIG. 14(a) is a graph of a sample linear chirp parameterized by its starting and ending frequencies.
FIG. 14(b) is a graph of the initial guess for the linear chirp parameters for use in an algorithm to estimate the true parameters from compressive measurements of the signal in FIG. 14(a).
FIG. 14(c) is a graph of the error between the original signal in FIG. 14(a) and the initial guess in FIG. 14(b).

Our second experiment concerns another smooth (but more challenging) manifold. We consider 1-D, length-N linear chirp signals, for which a 2-D parameter θ describes the starting and ending frequencies. Our test signal of length N=256 is shown in FIG. 14(a) and has starting and ending frequencies of 5.134 Hz and 25.795 Hz, respectively. To estimate the unknown parameters from random measurements, we use 10 iterations of the modified Newton's method in $\mathbb{R}^M$; our initial guess is shown in FIG. 14(b) and has starting and ending frequencies of 7 Hz and 23 Hz, respectively. FIG. 14(c) shows the relative error between the true signal and the starting guess.

When M=5(=2·2+1), we recover θ to very high accuracy (image MSE of $10^{-8}$ or less) in 55% of the trials. Increasing the probability of accurate recovery to 99% requires roughly M=30 measurements.

Edges

We now consider a simple image processing task: given random projections of an N-pixel image segment x, recover an approximation to the local edge structure. As a model for this local edge structure, we adopt the 2-D wedgelet manifold. (A wedgelet is a piecewise constant function defined on a dyadic square block, where a straight edge separates the two constant regions; it can be parameterized by the slope and offset of the edge.) Unlike our experiments above, this manifold is non-differentiable, and so we cannot apply Newton's method. Instead, we sample this manifold to obtain a finite collection of wedgelets, project each wedgelet to $\mathbb{R}^M$ using Φ, and search for the closest match to our measurements y=Φx. (Below we discuss a Multiscale Newton method that could be applied in non-differentiable cases like this.)

Figure 15:
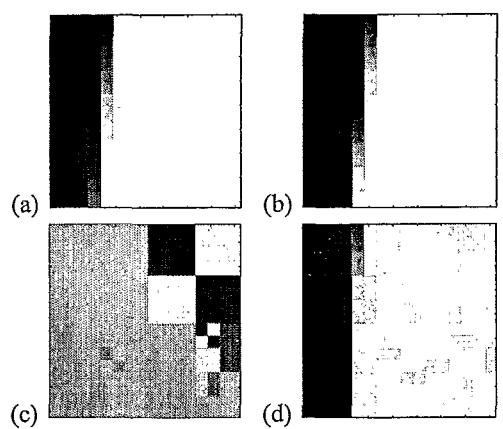
FIG. 15(a) is an image of a 16×16=256 pixel block containing an edge structure.
FIG. 15(b) is an image of the result of manifold-based recovery from just 5 random projections of the image in FIG. 15(a).
FIG. 15(c) is an image of the result of traditional CS recovery (OMP algorithm) from 7 random projections of the image in FIG. 15(a).
FIG. 15(d) is an image of the result of traditional CS recovery (OMP algorithm) from 50 random projections of the image in FIG. 15(a). Perfect OMP recovery requires 70 or more random projections.

As a first experiment (FIG. 15), we examine a perfect edge originating on the wedgelet manifold (but one that is not precisely among our discretized samples). We let N=16×16=256 and take M=5(=2·2+1) random projections. Although the sampling grid for the manifold search does not contain Φx precisely, we see in FIG. 15(b) that a very close approximation is recovered. In contrast, using traditional CS techniques to recover x from its random projections (seeking a sparse reconstruction using 2-D Haar wavelets) requires an order of magnitude more measurements.

Figure 16:
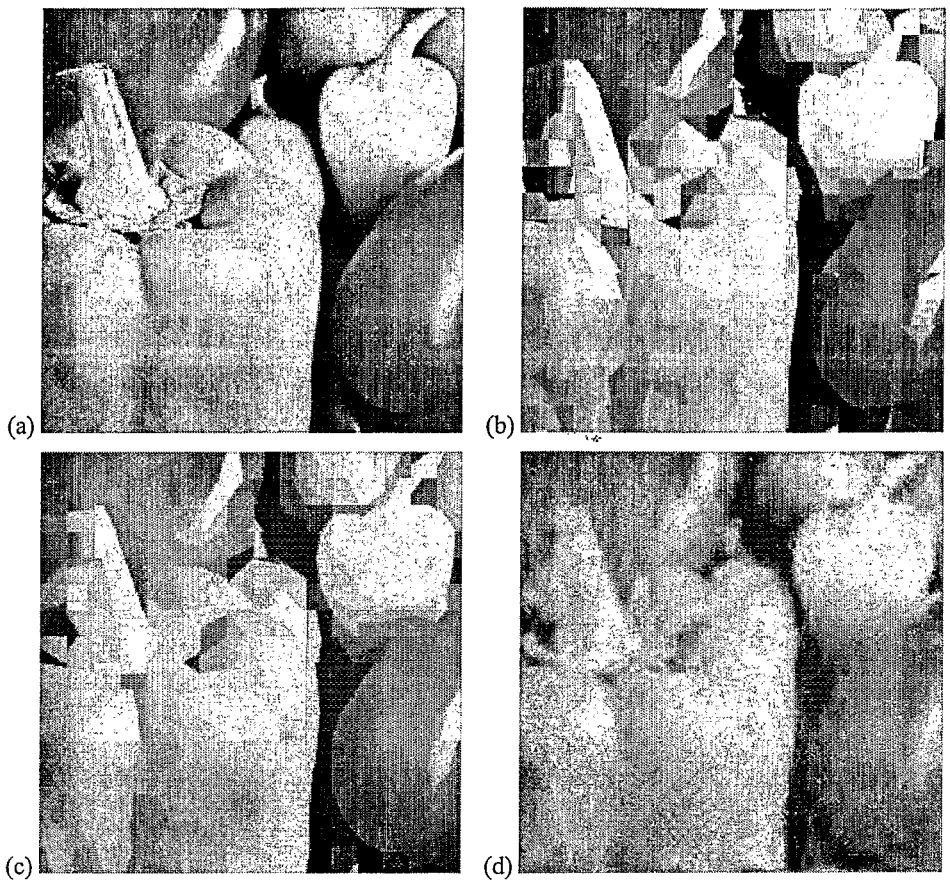
FIG. 16(a) is an image of a 256×256 Peppers test image.
FIG. 16(b) is an image of the result of block-by-block wedgelet estimation on 16×16 pixel tiles, using 10 random projections (plus the mean and energy) on each tile, for a total of (10+2)·256=3072 measurements.
FIG. 16(c) is an image of the best-possible wedgelet estimation, which would require all $256^2$=65536 pixel values.
FIG. 16(d) is an image of traditional CS-based recovery (from 3072 global random projections) using greedy pursuit to find a sparse approximation in the projected wavelet (D8) basis.

As a second experiment (FIG. 16) we analyze the robustness of the recovery process. For this we consider a 256×256 portion of the Peppers test image. We break the image into squares of size 16×16, measure each one using 10 random projections, and then search the projected wedgelet samples to fit a wedgelet on each block. (We also include the mean and energy of each block as 2 additional "measurements," which we use to estimate the 2 grayscale values for each wedgelet.) We see from the figure that the recovery is fairly robust and accurately recovers most of the prominent edge structure. The recovery is also fast, taking less than one second for the entire image. For point of comparison we include the best-possible wedgelet approximation, which would require all 256 numbers per block to recover. For reference, we also include the CS-based recovery from an equivalent number, (10+2)·256=3072, of global random projections. Though slightly better in terms of mean-square error, this approximation fails to prominently represent the edge structure (it also takes several minutes to compute using our software). We stress again, though, that the main purpose of this example is to illustrate the robustness of recovery on natural image segments, some of which are not well-modeled using wedgelets (and so we should not expect high quality wedgelet estimates in every block of the image).

4.7.3 Nondifferentiable Manifolds

Supposing $\mathcal{M}$ is not differentiable, however, we can no longer apply Newton's method for parameter estimation. (The projection of a non-differentiable manifold in $\mathbb{R}^N$ typically yields another non-differentiable manifold in $\mathbb{R}^M$.) To address this challenge, we can again rely on the multiscale insight described above: each non-differentiable manifold can be approximated using a sequence of differentiable manifolds that correspond to various scales of regularization of the original image. To get an approximate understanding of the behavior of a non-differentiable manifold under random projections, one could study the behavior of its smooth approximations under random projections.

Unfortunately, to solve the parameter estimation problem we cannot immediately apply the Multiscale Newton algorithm to the random measurements y=Φx_θ. Letting $g_s$ denote the regularization kernel at scale s, the problem is that the Multiscale Newton algorithm demands computing $(x_\theta * g_s)$, which would live on a differentiable manifold, but the hypothetical measurements $\Phi(x_\theta * g_s)$ of such a signal cannot be computed from the given measurements y=Φx_θ.

We propose instead a method for modifying the measurement matrix Φ in advance to accommodate non-differentiable manifolds. Our suggestion is based on the fact that, for a given measurement vector $\phi_i$, one can show that $$\langle \phi_i, x_\theta * g_s \rangle = \langle \phi_i * g_s, x_\theta \rangle.$$

Thus, by regularizing the measurement vectors $\{\phi_i\}$, the resulting image of the manifold in $\mathbb{R}^M$ will be differentiable. To accommodate the Multiscale Newton method, we propose specifically to (i) generate a random Φ, and (ii) partition the rows of Φ into groups, regularizing each group by a kernel $g_s$ from a sequence of scales $\{s_0, s_1, \ldots, s_L\}$. The Multiscale Newton method can then be performed on the regularized random measurements by taking these scales $\{s_0, s_1, \ldots, s_L\}$ in turn.

A similar sequence of randomized, multiscale measurement vectors were proposed in D. Donoho and Y. Tsaig, "Extensions of compressed sensing", Preprint, 2004 in which the vectors at each scale are chosen as a random linear combination of wavelets at that scale, and the resulting measurements can be used to reconstruct the wavelet transform of a signal scale-by-scale. A similar measurement process could be appropriate for our purposes, preferably by choosing random functions drawn from a coarse-to-fine succession of scaling spaces (rather than difference spaces). Our specified design, however, allows for more general smoothing kernels, some of which could be more effective for aiding multiscale parameter estimation.

Additionally, one may consider using noiselets, as described in R. Coifman, F. Geshwind, and Y. Meyer, "Noiselets", *Appl. Comput. Harmon. Anal.*, vol. 10, pp. 27-44, 2001, as measurement vectors. Noiselets are deterministic functions designed to appear "noise-like" when expanded in the wavelet domain and can be generated using a simple recursive formula. At each scale j, the noiselet functions give a basis for the Haar scaling space $V_j$ (the space of functions that are constant over every dyadic square at scale j). For a multiscale measurement system, one could simply choose a subset of these vectors at each scale. Again, however, smoother kernels could be more effective for aiding multiscale parameter estimation.

Experiments

Figure 17:
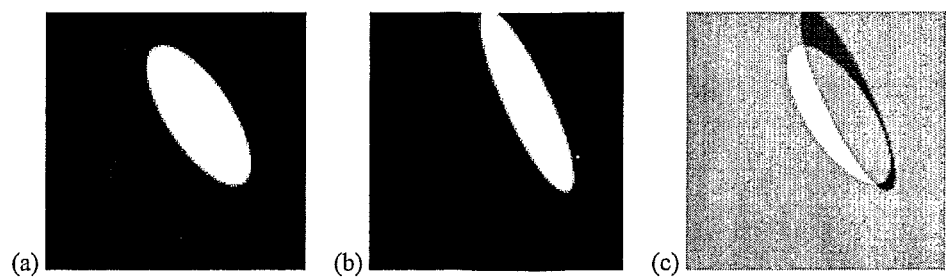
FIG. 17(a) is an image containing an ellipse parameterized by its position, rotation, and major and minor axes.
FIG. 17(b) is an image of the initial guess for the ellipse parameters for use in an algorithm to estimate the true parameters from compressive measurements of the image in FIG. 17(a).
FIG. 17(c) is an image of the error between the original image in FIG. 17(a) and the initial guess in FIG. 17(b).

As an experiment, we now consider the non-differentiable manifold consisting of parameterized ellipse images, where the 5-D parameter θ describes the translation, rotation, and major and minor axes of the ellipse. Our test image with N=128×128=16384 is shown in FIG. 17(*a*); our initial guess for estimation is shown in FIG. 17(*b*); and the relative initial error is shown in FIG. 17(*c*).

Figure 18:
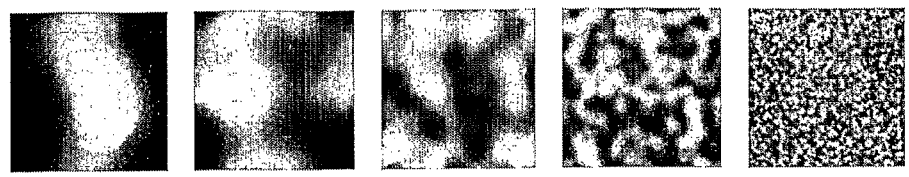
FIG. 18 is a collection of images of example random multiscale measurement vectors at a sequence of scales s=¼, ⅛, 1/16, 1/32, 1/128.

In each trial, we consider multiscale random measurement vectors (regularized Gaussian noise) taken at a sequence of 5 scales s=¼, ⅛, 1/16, 1/32, 1/128. FIG. 18 shows one random basis function drawn from each such scale. We take an equal number of random measurements at each scale, and to perform each Newton step we use all measurements taken up to and including the current scale.

Choosing M=6 random measurements per scale (for a total of 30 random measurements), we can recover the ellipse parameters with high accuracy (image MSE of $10^{-5}$ or less) in 57% of trials. With M=10 measurements per scale (50 total), this probability increases to 89%, and with M=20 measurements per scale (100 total), we see high accuracy recovery in 99% of trials.

Figure 19:
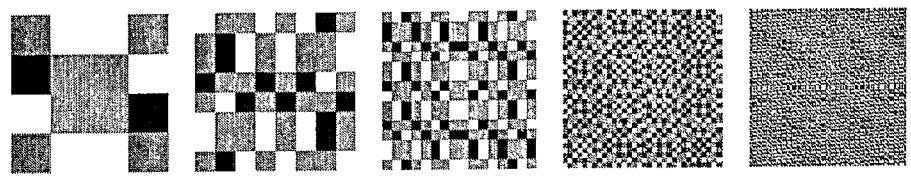
FIG. 19 is a collection of images of the real components of example noiselet measurement vectors at scales j=2, 3, 4, 5, 7.

Using noiselets for our measurement vectors (see FIG. 19 for example noiselet functions) we see similar performance. Choosing M=6 random noiselets per scale (30 total), we see high accuracy recovery in 13% of trials, but this probability increases to 59% with M=10 random noiselets per scale (50 total) and to 99% with M=22 random noiselets per scale (110 total). (Note that each noiselet is a complex-valued function; we take M/2 per scale, yielding M real measurements.)

In terms of the number of random measurements required for parameter estimation, it does appear that there is a moderate price to be paid in the case of non-differentiable manifolds. We note, however, that in our ellipse experiments the recovery does seem relatively stable, and that with sufficient measurements, the algorithm rarely diverges far from the true parameters.

4.7.4 Advanced and Multi-manifold Models for Signal Recovery and Parameter Estimation In our examples thus far, we have considered the case where a single manifold model is used to describe the signal x. Many manifolds, however, are intended as models for local signal structure, and for a given signal x there may in fact be multiple, local manifold models appropriate for describing the different parts of the signal. As an example, we may again consider wedgelets, which are appropriate for modeling locally straight edges in images. For an entire image, a tiling of wedgelets is much more appropriate as a model than a single wedgelet. In our CS experiment in FIG. 16, we used a wedgelet tiling to recover the image, but our random measurements were partitioned to have supports localized on each wedgelet. In other cases, it may be desireable to have measurement vectors that are global, each being supported over the entire signal. As a proof of concept in this section, we present several methods for joint parameter estimation across multiple manifolds in the case where the CS measurements have global support. As an illustration, we continue to focus on recovering wedgelet tilings.

We write y=Φx, where x now represents the entire image. We note that the influence of a particular wedgelet block will be restricted to relatively few columns of Φ, and the rest of the image may have a large influence on the measurements y.

Figure 20:
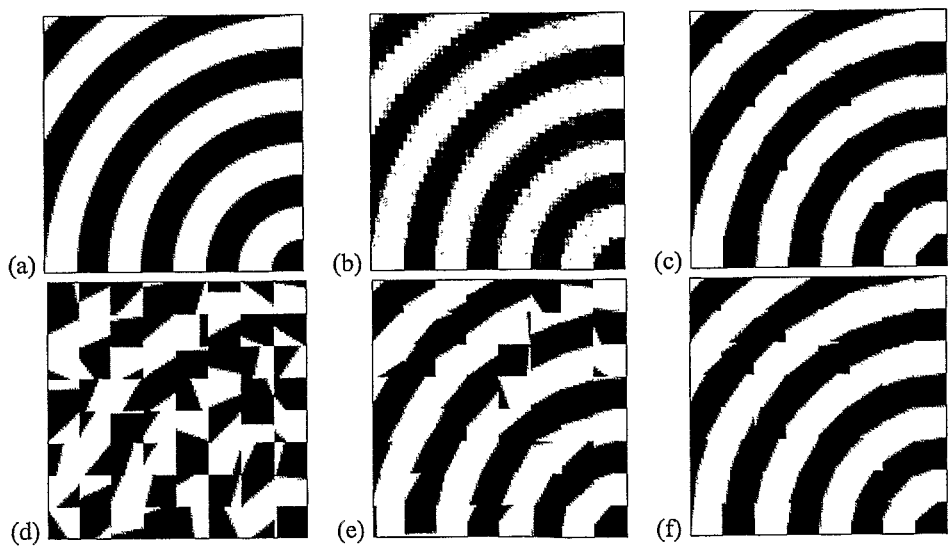
FIG. 20(a) is a 128×128 quarter-bullseye test image.
FIG. 20(b) is an image of the result of wavelet thresholding of the image in FIG. 20(a) with 640 largest Haar wavelet coefficients, resulting in PSNR 18.1 dB. (The peak signal-to-noise ratio (PSNR), derives directly from the mean-square error, or MSE; assuming a maximum possible signal intensity of I, $$PSNR := 10 \log_{10} \frac{I^2}{MSE}.)$$
FIG. 20(c) is an image of the result of oracle wedgelet approximation to the image in FIG. 20(a) using wedgelets of size 16×16 pixels, resulting in PSNR 19.9 dB.
FIG. 20(d) is an image of the result of independent block-by-block wedgelet estimation recovered from M=640 global random projections of the image in FIG. 20(a), resulting in PSNR 7.1 dB.
FIG. 20(e) is an image of the result of iterative, successively refined block-by-block wedgelet estimation recovered from M=640 global random projections of the image in FIG. 20(a), after 5 iterations across all blocks, resulting in PSNR 13.6 dB.
FIG. 20(f) is an image of the result of iterative, successively refined block-by-block wedgelet estimation recovered from M=640 global random projections of the image in FIG. 20(a), after 10 iterations across all blocks, resulting in PSNR 19.1 dB.

As a first attempt at recovering the parameters for each block, we propose to estimate the image block-by-block, fitting a wedgelet to each block as if y were a noisy measurement of that block alone. FIG. 20(*a*), for example, shows a 128×128 test image from which we take M=640 global random measurements, and FIG. 20(*d*) shows the block-by-block estimates using 16×16 wedgelets. (For simplicity in this section we use a nearest neighbor grid search to obtain wedgelet estimates in $\mathbb{R}^M$.) These estimates provide a rough sketch of the true image structure.

As an alternative technique to the independent block-by-block estimation procedure above, we present here a simple but effective algorithm for joint parameter estimation. The algorithm we propose is simply to use the local estimates (shown in FIG. 20(*d*)) as an initial guess for the wedgelet on each block, then perform block-by-block estimates again on the residual measurements (subtracting off the best guess from each other block). FIG. 20(*e*) and FIG. 20(*f*) show the result of this successive estimation procedure after 5 and 10 iterations, respectively. After 10 iterations, the recovered wedgelet estimates approach the quality of oracle estimates for each block (FIG. 20(*c*)), which would require all 128×128 pixel values. Instead, our estimates are based on only 640 global random projections, an average of 10 measurements per wedgelet block. For point of comparison, we show in FIG. 20(*b*) the best 640-term representation from the 2-D Haar wavelet dictionary; our wedgelet estimates outperform even this upper bound on the performance of sparsity-based CS recovery.

Thus, we have proposed a simple iterative refinement algorithm that can distill local signal information from the global measurements y. Wedgelets can also be used, however, as more than a local model for signal structure. While each wedgelet is designed to capture edge structure on a single block, these blocks are related in space and in scale. A multiscale wedgelet model would capture both of these effects and encourage more accurate signal recovery. As one attempt to access the multiscale structure, we describe a top-down, coarse-to-fine wedgelet estimation algorithm, where at each scale we use the single-scale iterative algorithm described above, but the starting guess for each scale it obtained from the previous (coarser) scale.

Figure 21:
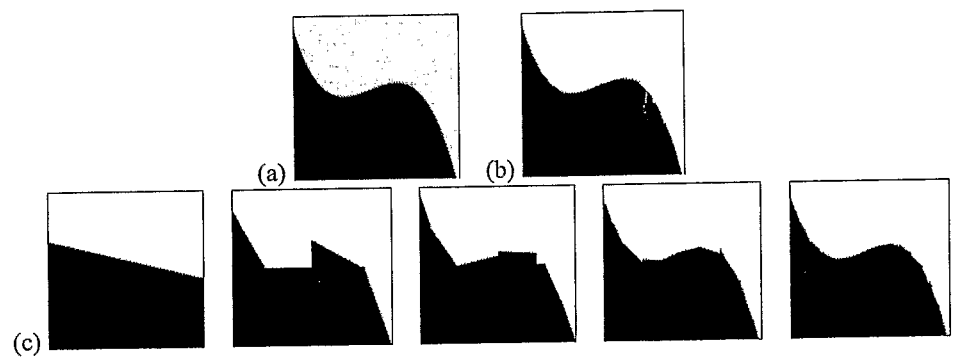
FIG. 21(a) is a 128×128 single-curve test image.
FIG. 21(b) is an image of the result of oracle wedgelet approximation to the image in FIG. 21(a) using wedgelets of size 8×8 pixels, resulting in PSNR 26.9 dB.
FIG. 21(c) is a collection of images resulting from successive wedgelet estimates from a top-down multiscale estimation algorithm recovered from M=384 global random measurements of the image in FIG. 21(a). From left to right, these images show wedgelets of size 128×128, 64×64, 32×32, 16×16, and 8×8; the final PSNR is 26.5 dB.

Consider for example the 128×128 test image in FIG. 21(*a*). For this image we take M=384 global random measurements. Using our multiscale estimation procedure, FIG. 21(*c*) shows our sequence of estimates for wedgelet block sizes 128×128, 64×64, 32×32, 16×16, and finally 8×8. Thanks to the multiscale model, the quality of our ultimate wedgelet estimates on 8×8 blocks is comparable to the best-possible oracle wedgelet estimates (shown in FIG. 21(*b*)).

4.7.5 Additional Applications in Multi-Signal Processing

As new capabilities continue to emerge for data acquisition, storage, and communication, and as demand continues to increase for immersive multimedia, medical imaging, remote sensing, and signals intelligence, the importance of effective techniques for multi-signal processing will only continue to grow.

As with the traditional case of single-signal processing, the first step in developing efficient algorithms for multi-signal processing is an accurate model for the signals of interest. Ideally, this model should capture the joint structure among the signals in addition to their individual structure. Our Joint Sparsity Models (JSMs) which we introduced for Distributed (i.e., multi-signal) Compressed Sensing (DCS), for example, were intended to capture both types of structure using the notion of sparsity. (See M. B. Wakin, S. Sarvotham, M. F. Duarte, D. Baron, and R. G. Baraniuk, "Recovery of jointly sparse signals from few random projections", *Proceedings of Neural Information Processing Systems (NIPS)*, 2005.) A typical JSM dictates not only that each signal in the collection has a sparse representation in some basis, but that these sparsities are somehow related across the signals, for example, that each signal be well approximated as different linear combination of the same few atoms from a dictionary $\Psi$ but with different coefficients. The DCS paradigm is then to acquire independent compressive measurements of each signal but then to jointly reconstruct the entire suite of signals by searching for the signal collection most favorable under the JSM that is also consistent with the measurements.

We can also imagine, however, many scenarios in which multiple signals may be acquired under very similar conditions (differing only in a few parameters controlling the acquisition of the signals). Some possible examples include:
  frames of a video sequence, differing only in the timestamp,
  radiographic slices from a computed tomographic (CT) scan or cryo-electron microscopy (cryo-EM) image, differing only in the relative position with respect to the subject, or
  images from a surveillance or entertainment camera network, differing only in the position of each camera.
In each of the above cases we have some common phenomenon X that represents the fundamental information of interest (such as the motion of an object in the video or the true 3-D structure of a molecule being imaged), and we collect information via signals that depending both on X and on the parameters $\theta$ of the acquisition process. From these signals we may wish to conclude information about X.

If we fix X in the above scenario, then it follows that as $\theta$ changes, the various signals will represent samples of some manifold $\mathcal{M}_X$ (e.g., in $\mathbb{R}^N$). We argued above, however, that the structure of a manifold will be well-preserved under random projection to a lower-dimensional space. This suggests that it may be possible to generalize DCS far beyond our JSMs to incorporate a wide variety of manifold-based models. In our above scenarios, this would involve collecting small number M of random projections from each viewpoint, rather than the size-N signal itself. Depending on the problem, this could significantly reduce the storage or communication demands.

The real challenge in such a generalization of DCS would be developing methods for recovering information about X based on random projections of samples from $\mathcal{M}_X$. While we believe that developing successful methods will likely be highly problem-dependent, we present here one final experiment to as a basic demonstration of feasibility.

Figure 22:
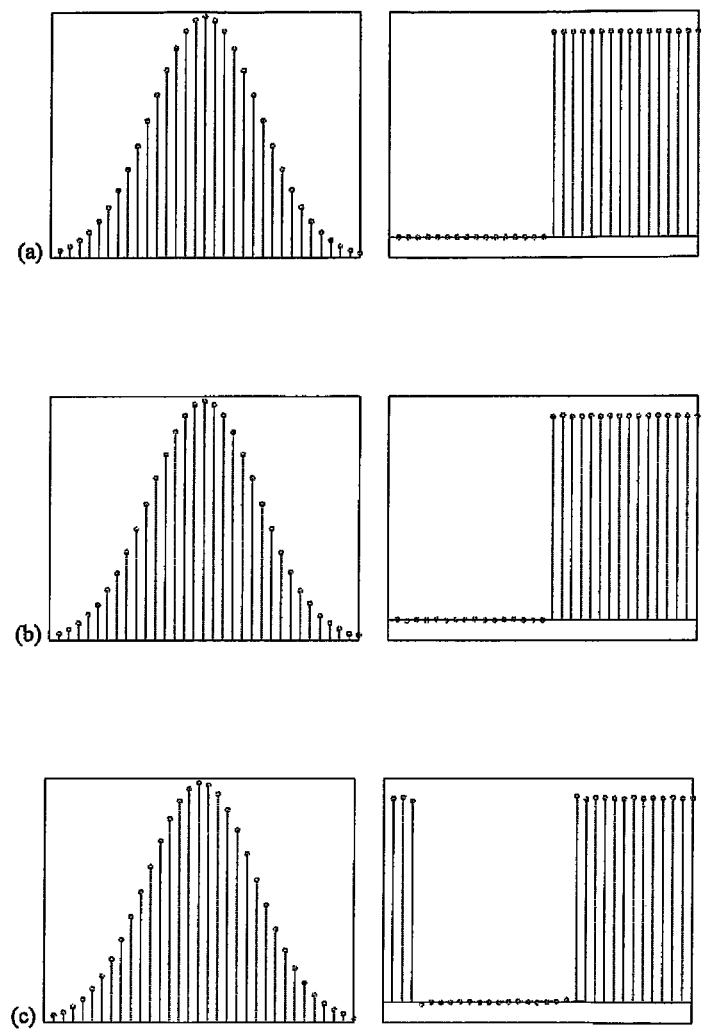
FIG. 22(a) is a graph of a length-32 1-D signal X for our experiment.
FIG. 22(b) is a graph of the reconstruction of FIG. 22(a) using 20 random projections to $\mathbb{R}^3$ of various known delays of X.
FIG. 22(c) is a graph of the reconstruction of FIG. 22(a) using 20 random projections to $\mathbb{R}^{10}$ of various unknown delays of X.

Our scenario for this experiment involves 1-D signals. We let $X \in \mathbb{R}^N$ denote a signal that we wish to learn. FIG. 22(*a*) plots two different X with N=32. Instead of X, we observe random projections of shifts of X. That is, $\theta$ represents the amount of shift and $\mathcal{M}_X \subset \mathbb{R}^{32}$ represents all circular shifts of X (including noninteger shifts so that the manifold is continuous). From samples of $\Phi \mathcal{M}_X$ in $\mathbb{R}^M$ we wish to recover X. In a sense, this is a manifold recovery problem—there exist an infinite number of candidate manifolds $\mathcal{M} \subset \mathbb{R}^N$ that would project to the same image $\Phi \mathcal{M}_X$. We must use the constraints of our acquisition system as a model and seek a manifold $\mathcal{M} \subset \mathbb{R}^N$ on which each signal is a shift of every other signal.

We begin with the case where each sample is labeled with its shift parameter $\theta$. In this case, we can successfully "lift" the manifold from $\mathbb{R}^M$ back to $\mathbb{R}^N$ using an iterative estimation procedure. We construct an orthonormal basis $\Psi$ in $\mathbb{R}^N$ and estimate the expansion coefficients for X iteratively in order to maximize agreement with the observed data. The results of this algorithm are shown in FIG. 22(*b*). Using just M=3 random projections from just 20 labeled samples we recover a highly accurate approximation to X.

The unlabeled case is more difficult, but it is possible to estimate the unknown shift parameters $\theta$ as well. We begin by computing geodesic distances among the sampled points in $\mathbb{R}^M$ and use the relative spacing as initial guesses for $\theta$. We then alternate between the above iterative algorithm and refining our estimates for the $\theta$. The results of are shown in FIG. 22(*c*). In this case, we require about M=10 random projections from each of 20 unlabeled samples to recover a good approximation to X. (The shift with respect to X of the step function is irrelevant.)

This simple experiment demonstrates that manifold recovery from random projections is indeed possible by enforcing the physical constraints dictated by the data collection process. Other possible applications are in image processing and 3-D scene reconstruction.

4.7.6 Extensions to Detection and Classification

As in previous sections, we may consider problems more general than parameter estimation, this time in the context of manifold-based signal models.

Among many possible application areas in which it is immediately apparent that the above results (such as the stable embedding of manifolds under random low-dimensional projections) are useful in the following settings:
  Face recognition, automatic handwriting interpretation, or other classification tasks, in which a signal may live on one of a multitude of possible manifolds (each either known parametrically or simply by a collection of training data), and from compressive measurements we would like to determine the manifold to which the signal belongs.
  Identity authentication or other detection tasks, in which a signal may undergo a binary test to determine whether or not it belongs to a given manifold. (Again the manifold may be known parametrically, or only by a collection of training data from which structure of the manifold may be deduced.)
  Manifold learning, in which the structure of a manifold (or the nature of an underlying parameterization) is learned from a collection of training data living on or near that manifold. Thanks to the stable embedding, which approximately preserved many relevant features of the manifold (dimension, topology, curvature, geodesic distances, etc.), such structure could also be learned from compressive measurements of the training data.

4.8 Additional Models for Estimation, Detection, and Classification with Compressive Measurements Still other methodologies for estimation, detection and classification of signals are amenable to the compressive measurement framework formulated by the invention. In the k-nearest neighbor classification algorithm, an input signal $x \in \mathbb{R}^N$ is assigned to the class label that is prevalent among the k closest vectors among a set $\{s_i\}$, i=1, ..., S of training vectors, for a given distance metric $\|\cdot\|$. In the case of Euclidean distance, and for a randomly drawn measurement matrix of size M×N, the evaluation can performed by the algorithm using the compressive measurements on the input signal s against the set of compressive measurements for each one of the S training vectors. We have shown previously that $$(1-\epsilon)\sqrt{\frac{M}{N}} \leq \frac{\|\Phi(x-s_i)\|_2}{\|x-s_i\|_2} \leq (1+\epsilon)\sqrt{\frac{M}{N}}.$$

for any $i \in \{1, ..., S\}$ with probability at least $1-\delta$ for the case where $\Phi$ is a projection onto a random subspace, or a randomly drawn matrix, provided that $$\epsilon < \sqrt{\frac{12 \log\left(\frac{2(2|S|+1)}{\delta}\right)}{M}}.$$

Thus, one can quantify the increase in the probability of error for such classifier, following the treatment of the ambient signal classification method.

Furthermore, in the setting of maximum likelihood classification, each class $C_i$, i=1, ..., S is assigned a probability distribution $f_i(x)$, with the classifier making a decision $\hat{C}(x) = \arg\max_{i=1, ..., S} f_i(x)$. For the case where the classes receive multivariate gaussian distributions, i.e. $f_i(x) = \mathcal{N}(\mu_i, \Sigma_i)$, i=1, ..., S, the classifier can operate in the compressive measurement domain—with measurement matrix $\Phi$—by generating modified probability distributions $\hat{f}_i(x) = \mathcal{N}(\Phi\mu_i, \Phi\Sigma_i\Phi^T)$, i=1, ..., S. Just as in the previous setting, one can quantify the increase in the probability of error in the same fashion as in the ambient signal classification framework:

$$P_e = \sum_{i=1,...,S} \sum_{j=1,...,S, j \neq i} P(\hat{f}(x) = j \mid x \in C_i).$$

In addition to these classification settings, it is clear that the preservation of distance property is useful in a wide variety of additional detection, estimation, and classification problems, and one skilled in the art could easily adapt many existing algorithms to effectively utilize compressive measurements.

4.9 Additional Embodiments

IDEA, as described in Section 4.6 provides reliable detection performance from just a few incoherent measurements when the signals of interest are sparse or compressible in some basis or dictionary. In addition to its efficiency gains over CS reconstruction in terms of the number of measurements and computations required, IDEA shares the many known benefits of CS reconstruction, including the universality of random measurements, progressivity, and resilience to noise and quantization.

The extension of IDEA to other signal+interference scenarios is straightforward. When the sparse signal decomposition can be parameterized, i.e., when each signal dictionary vector $\psi_i = f(\beta_i)$ with $\beta$ a parameter vector, the CS methodology enables new algorithms for parameter estimation and other statistical signal processing tasks. An especially promising application is in CS acquisition of streaming signals; detection experiments with the random filtering approach of J. Tropp and A. C. Gilbert, "Signal recovery from partial information via orthogonal matching pursuit", Preprint, April 2005 found little to no performance degradation for streaming signals.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for estimating the value of a function f of an unknown signal x from compressive measurements of said unknown signal x, the method comprising the steps of:
    (a) obtaining compressive measurements of an unknown signal x; and
    (b) determining a value of a function f most consistent with said obtained compressive measurements.

2. A method for estimating the value of a function f of an unknown signal x according to claim 1, wherein said determining step comprises generating an estimate of x.

3. A method for determining which among a plurality of candidate signal models is most consistent with a signal x using a set of compressive measurements of said signal x, the method comprising the steps of:
    (a) obtaining a set of compressive measurements of a signal x; and
    (b) comparing said set of compressive measurements to measurements one would expect under various candidate signal models.

4. A method for determining which among a plurality of candidate signal models is most consistent with a signal x according to claim 3, wherein said comparing step comprises comparing said set of compressive measurements with every candidate signal model.

5. A method for determining which among a plurality of candidate signal models is most consistent with a signal x according to claim 3, wherein said comparing step comprises generating an estimate of x.

6. A method for estimating, from compressive measurements of a signal x, one or more unknown parameters θ on which the signal x depends, the method comprising the steps of:
    (a) obtaining compressive measurements of a signal x; and
    (b) determining an appropriate value of θ most consistent with said obtained compressive measurements.

7. A method according to claim 6, wherein said determining step comprises generating an estimate of x that is then used to estimate θ.

8. A method for determining whether an unknown signal x is sparse or compressible in a known dictionary Ψ from compressive measurements of said signal x, the method comprising the steps of:
    (a) obtaining compressive measurements of a signal x; and
    (b) determining whether said compressive measurements of said signal x are consistent with the signal x being sparse or compressible in the dictionary Ψ; and (c) applying some measure of the sparsity or compressibility to the estimate.

9. A method according to claim 8, wherein said determining step comprises attempting to obtain a rough reconstruction of the Signal x using the dictionary.

10. A method for determining which dictionary from among a plurality of dictionaries $\Psi_i$ an unknown signal x yields the most sparse or compressible representation of the signal x, the method comprising the steps of:
   (a) obtaining compressive measurements of a signal x;
   (b) determining how consistent said compressive measurements of said signal x are with the signal x being sparse or compressible in each dictionary $\Psi_i$ by estimating a set of expansion coefficients in each dictionary consistent with generating said compressive measurements; and applying some measure of sparsity or compressibility to said estimated expansion coefficients in each dictionary; and
   (c) selecting a dictionary $\Psi_j$ that is most consistent with the compressive measurements of the signal x and the simultaneous assumption that the signal x is sparse in that dictionary.

11. A method according to claim 10, wherein said determining step comprises attempting to obtain a rough reconstruction of the signal x using each dictionary $\Psi_i$.

12. A method as in claim 1 wherein a result of the step of determining a value is used to select an appropriate basis for a full reconstruction of the signal.

13. A method as in claim 3 wherein a result of the step of comparing is used to classify the signal into classes corresponding to respective dictionaries.

14. A method for estimating a the value of a function f of an unknown signal x, determining which among a plurality of candidate signal models is most consistent with the signal x, or determining whether the signal x is sparse or compressible in a known dictionary $\Psi$ from compressive measurements of said signal x in the case where said signal x is contaminated with interference, the method comprising the steps of:
   (a) obtaining compressive measurements of a signal x;
   (b) using a model for a structure of interference contaminating said signal x to obtain an estimate of the interference, and
   (c) estimating the value of the function f(x) of said signal x, determining a signal model most consistent with the compressive measurements of said signal x, or determining whether the signal x is sparse or compressible in a known dictionary $\Psi$.

15. A method for determining which among a plurality of candidate signal models is most consistent with a signal x according to claim 3, wherein an estimate of x is generated to be consistent with measurements one would expect under one of said various signal models.

16. A method for estimating the value of an unknown signal X from compressive measurements of one or more signals $x_i$ that depend on the value of X, the method comprising the steps of:
   (a) obtaining compressive measurements each signal $x_i$; and
   (b) determining a value of X most consistent with said obtained compressive measurements.

17. A method for estimating the value of an unknown signal X from compressive measurements of one or more signals $x_i$ according to claim 16, wherein the dependence of the signals $x_i$ on the value X is known explicitly.

18. A method for estimating the value of an unknown signal X from compressive measurements of one or more signals $x_i$ according to claim 17, wherein said determining step comprises generating an estimate of each $x_i$, from which the value X is then determined as to be most consistent with said estimates of each $x_i$.

19. A method for estimating the value of an unknown signal X from compressive measurements of one or more signals $x_i$ according to claim 16, wherein the dependence of each signal $x_i$ on the value X is known save for an unknown parameter collection $\theta_i$.

20. A method for estimating the value of an unknown signal X from compressive measurements of one or more signals $x_i$ according to claim 19, wherein said determining step comprises generating an estimate of each $x_i$, from which the value X is then determined as to be most consistent with said estimates of each $x_i$.

21. A method for estimating the value of an unknown signal X from compressive measurements of one or more signals $x_i$ according to claim 19, wherein said determining step comprises generating an estimate of each $\theta_i$ and $x_i$, from which the value X is then determined as to be most consistent with said estimates of each $x_i$ under said estimates of parameters $\theta_i$.

* * * * *